(12) United States Patent
Ohmori et al.

(10) Patent No.: US 11,069,389 B2
(45) Date of Patent: Jul. 20, 2021

(54) MAGNETIC MEMORY AND MAGNETIC MEMORY RECORDING METHOD

(71) Applicant: SONY SEMICONDUCTOR SOLUTIONS CORPORATION, Kanagawa (JP)

(72) Inventors: Hiroyuki Ohmori, Kanagawa (JP); Masanori Hosomi, Tokyo (JP); Yutaka Higo, Kanagawa (JP); Hiroyuki Uchida, Kanagawa (JP); Naoki Hase, Tokyo (JP); Yo Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/488,994

(22) PCT Filed: Jan. 22, 2018

(86) PCT No.: PCT/JP2018/001696
§ 371 (c)(1),
(2) Date: Aug. 27, 2019

(87) PCT Pub. No.: WO2018/163618
PCT Pub. Date: Sep. 13, 2018

(65) Prior Publication Data
US 2020/0020376 A1 Jan. 16, 2020

(30) Foreign Application Priority Data
Mar. 9, 2017 (JP) .............................. JP2017-044676

(51) Int. Cl.
*G11C 11/16* (2006.01)
*H01L 43/08* (2006.01)
(Continued)

(52) U.S. Cl.
CPC ............ *G11C 11/161* (2013.01); *H01L 43/08* (2013.01); *H01L 43/10* (2013.01); *H01L 27/222* (2013.01)

(58) Field of Classification Search
CPC .......... G11C 11/18; G11C 11/16; G11C 11/15
See application file for complete search history.

(56) References Cited

U.S. PATENT DOCUMENTS

2014/0056060 A1  2/2014  Khvalkovskiy et al.
2015/0097159 A1*  4/2015  Apalkov ............... H01F 41/302
                                                      257/31
(Continued)

FOREIGN PATENT DOCUMENTS

JP  2014-045196 A  3/2014
JP  2017-112359 A  6/2017
(Continued)

OTHER PUBLICATIONS

International Search Report and Written Opinion of PCT Application No. PCT/JP2018/001696, dated Apr. 3, 2018, 10 pages of ISRWO.
(Continued)

*Primary Examiner* — Han Yang
(74) *Attorney, Agent, or Firm* — Chip Law Group

(57) ABSTRACT

To provide a magnetic memory capable of performing stable recording while suppressing occurrence of an inversion error. Provided is a magnetic memory including a spin orbit layer in which a spin-polarized electron is generated by a current, a magnetic memory element having a laminated structure including a magnetic layer in which a magnetization direction changes according to information to be recorded and an insulating layer, and provided on the spin orbit layer, and a voltage application layer for applying a voltage to the magnetic layer via the insulating layer, in which the voltage application layer applies a voltage to the (Continued)

magnetic layer at a same time as the current flowing in the spin orbit layer to change magnetic anisotropy or a magnetic damping constant of the magnetic layer.

8 Claims, 19 Drawing Sheets

(51) Int. Cl.
  *H01L 43/10* (2006.01)
  *H01L 27/22* (2006.01)

(56) References Cited

U.S. PATENT DOCUMENTS

| | | | |
|---|---|---|---|
| 2015/0200003 A1 | 7/2015 | Buhrman et al. | |
| 2016/0232959 A1* | 8/2016 | Lee | H01L 43/10 |
| 2017/0117027 A1 | 4/2017 | Braganca et al. | |
| 2017/0178705 A1* | 6/2017 | Buhrman | G11C 11/1675 |
| 2017/0236570 A1* | 8/2017 | Kent | G11C 11/161 |
| | | | 365/158 |
| 2018/0351087 A1* | 12/2018 | Choi | H01F 10/329 |
| 2019/0088302 A1* | 3/2019 | Shimomura | G11C 11/18 |

FOREIGN PATENT DOCUMENTS

| | | |
|---|---|---|
| JP | 6258452 B1 | 1/2018 |
| WO | 2014/025838 A1 | 2/2014 |
| WO | 2016/011435 A1 | 1/2016 |

OTHER PUBLICATIONS

Office Action for TW Patent Application No. 107105910, dated Apr. 29, 2021, 04 pages of Office Action.

* cited by examiner

MAGNETIC MEMORY AND MAGNETIC MEMORY RECORDING METHOD

CROSS REFERENCE TO RELATED APPLICATIONS

This application is a U.S. National Phase of International Patent Application No. PCT/JP2018/001696 filed on Jan. 22, 2018, which claims priority benefit of Japanese Patent Application No. JP 2017-044676 filed in the Japan Patent Office on Mar. 9, 2017. Each of the above-referenced applications is hereby incorporated herein by reference in its entirety.

TECHNICAL FIELD

The present disclosure relates to a magnetic memory and a magnetic memory recording method.

BACKGROUND ART

With the rapid development of various information devices from high-capacity servers to mobile terminals, higher performance such as higher integration, higher speed, lower power consumption, and the like is pursued in elements such as memories and logics constituting the information devices. In particular, the progress in non-volatile semiconductor memories are remarkable. For example, flash memories as large-capacity file memories have become popular to drive hard disk drives out. Meanwhile, considering application to code storage applications and working memories, development of various types of semiconductor memories such as ferroelectric random access memories (FeRAMs), magnetic random access memories (MRAMs), and phase-change random access memories (PCRAMs) is in progress in order to replace NOR flash memories, dynamic random access memories (DRAMs), and the like that are generally used at present. Note that some of these semiconductor memories have already been put to practical use.

The MRAM, which is one of the above-described semiconductor memories, records information using change in electric resistance by changing a magnetization state of a magnetic body of a magnetic memory element of the MRAM. Such an MRAM is capable of performing high-speed operation and capable of being rewritten almost infinitely ($10^{15}$ times or more), and is already used in fields such as industrial automation and aircraft because of its high reliability. Moreover, the MRAM is expected to be developed into code storage and working memory in the future because of its high speed operation and high reliability.

Among such MRAMs, an MRAM that inverts magnetization of the magnetic body using spin torque magnetization inversion is expected much because of capable of achieving lower power consumption and larger capacity using the above-described advantages such as the high speed operation. Note that the MRAM using such spin torque magnetization inversion is called spin transfer torque-magnetic random access memory (STT-MRAM).

Furthermore, to further advance a larger capacity in the MRAM, further reduction of an inversion current for inverting the magnetization is required. As one of methods, a spin orbit torque-magnetic random access memory (SOT-MRAM) for recording information using spin orbit torque caused in spin polarization induced when a current flows in a nonmagnetic metal is being studied.

A basic configuration of a magnetic memory element of the SOT-MRAM includes a magnetic layer in which a magnetization direction is changed to record information, a spin orbit layer that provides spin orbit torque to the magnetic layer, and a mechanism for reading information recorded in the magnetic layer. For example, Patent Document 1 and Non-Patent Document 1 below disclose SOT-MRAMs that invert the magnetization direction using spin orbit torque.

CITATION LIST

Patent Document

Patent Document 1: Japanese Patent Application Laid-Open No. 2014-45196

Non-Patent Document

Non-Patent Document 1: Applied Physics Letters 104, 042406 (2014)
Non-Patent Document 2: Nature Materials 3172 (2012)

SUMMARY OF THE INVENTION

Problems to be Solved by the Invention

By the way, the magnetic layer of the magnetic memory element of the SOT-MRAM can be formed by either an in-plane magnetization film or a perpendicular magnetization film. However, use of the perpendicular magnetization film is favorable for the larger capacity of the SOT-MRAM. In the case of using the perpendicular magnetization film as the magnetic layer, a force to rotate the magnetization direction continues to act on the magnetic layer while the current flows in the spin orbit layer. Therefore, to stably invert the magnetization direction of the magnetic layer in a desired direction, strict control of a current value and a time width (pulse width) of a pulse current to flow in the spin orbit layer is required.

However, in a magnetic memory in which a plurality of magnetic memory elements is integrated, characteristics of the magnetic memory elements vary, and optimum values of the current value and the pulse width for stably inverting the magnetization direction of the magnetic layer in the desired direction are different in each magnetic memory element. Moreover, since the above optimum values change according to the temperature or the like of an environment where the magnetic memory is used, favorable control of the current value and the pulse width of the current to flow in the spin orbit layer is difficult. Therefore, suppression of occurrence of an inversion error in which the magnetic layer of the magnetic memory element is not inverted as desired or is unintentionally inverted is difficult.

Therefore, the present disclosure proposes a magnetic memory and a magnetic memory recording method capable of performing stable recording while suppressing occurrence of an inversion error.

Solutions to Problems

According to the present disclosure, provided is a magnetic memory including: a spin orbit layer in which a spin-polarized electron is generated by a current; a magnetic memory element having a laminated structure including a magnetic layer in which a magnetization direction changes according to information to be recorded and an insulating layer, and provided on the spin orbit layer; and a voltage application layer for applying a voltage to the magnetic layer via the insulating layer, in which the voltage application layer applies a voltage to the magnetic layer at a same time as the current flowing in the spin orbit layer to change magnetic anisotropy or a magnetic damping constant of the magnetic layer.

According to the present disclosure, provided is a magnetic memory including: a plurality of magnetic memory elements arranged in a matrix manner, each magnetic memory element having a laminated structure including a magnetic layer in which a magnetization direction changes according to information to be recorded and an insulating layer, a plurality of spin orbit layers provided to correspond to each magnetic memory element column including the plurality of magnetic memory elements arranged along a first direction, and in which a spin-polarized electron is generated by a current, and a plurality of voltage application layers provided to correspond to each magnetic memory element row including the plurality of magnetic memory elements arranged along a second direction orthogonal to the first direction, and configured to apply a voltage to the respective magnetic layers of the plurality of magnetic memory elements included in the each magnetic memory element row via the insulating layer, in which the voltage application layer applies the voltage to the magnetic layer of the corresponding magnetic memory element at a same time as the current flowing in the spin orbit layer to change magnetic anisotropy or a magnetic damping constant of the magnetic layer.

According to the present disclosure, provided is a magnetic memory recording method, the magnetic memory including a spin orbit layer in which a spin-polarized electron is generated by a current, a magnetic memory element having a laminated structure including a magnetic layer in which a magnetization direction changes according to information to be recorded and an insulating layer, and provided on the spin orbit layer, and a voltage application layer for applying a voltage to the magnetic layer via the insulating layer, the method including: applying a first voltage to the magnetic layer to lower magnetic anisotropy of the magnetic layer or to lower a magnetic damping constant and causing a current to flow in the spin orbit layer at a same time by the voltage application layer.

According to the present disclosure, provided is a magnetic memory recording method, the magnetic memory including a spin orbit layer in which a spin-polarized electron is generated by a current, a magnetic memory element having a laminated structure including a magnetic layer in which a magnetization direction changes according to information to be recorded and an insulating layer, and provided on the spin orbit layer, and a voltage application layer for applying a voltage to the magnetic layer via the insulating layer, the method including: causing a current to flow in the spin orbit layer and applying a third voltage to the magnetic layer to improve magnetic anisotropy of the magnetic layer or to improve a magnetic damping constant by the voltage application layer behind the current or after the current decreases.

According to the present disclosure, provided is a magnetic memory recording method, the magnetic memory including a plurality of magnetic memory elements arranged in a matrix manner, each magnetic memory element having a laminated structure including a magnetic layer in which a magnetization direction changes according to information to be recorded and an insulating layer, a plurality of spin orbit layers provided to correspond to each magnetic memory element column including the plurality of magnetic memory elements arranged along a first direction, and in which a spin-polarized electron is generated by a current, and a plurality of voltage application layers provided to correspond to each magnetic memory element row including the plurality of magnetic memory elements arranged along a second direction orthogonal to the first direction, and configured to apply a voltage to the respective magnetic layers of the plurality of magnetic memory elements included in the each magnetic memory element row via the insulating layer, the method including: controlling the voltage to be applied to the magnetic layer by the voltage application layer to select the magnetic memory element to which information is recorded.

Effects of the Invention

As described above, according to the present disclosure, stable recording can be performed while suppressing occurrence of an inversion error.

Note that the above-described effect is not necessarily limited, and any of effects described in the present specification or other effects that can be grasped from the present specification may be exerted in addition to or in place of the above-described effect.

MODE FOR CARRYING OUT THE INVENTION

Figure 1:
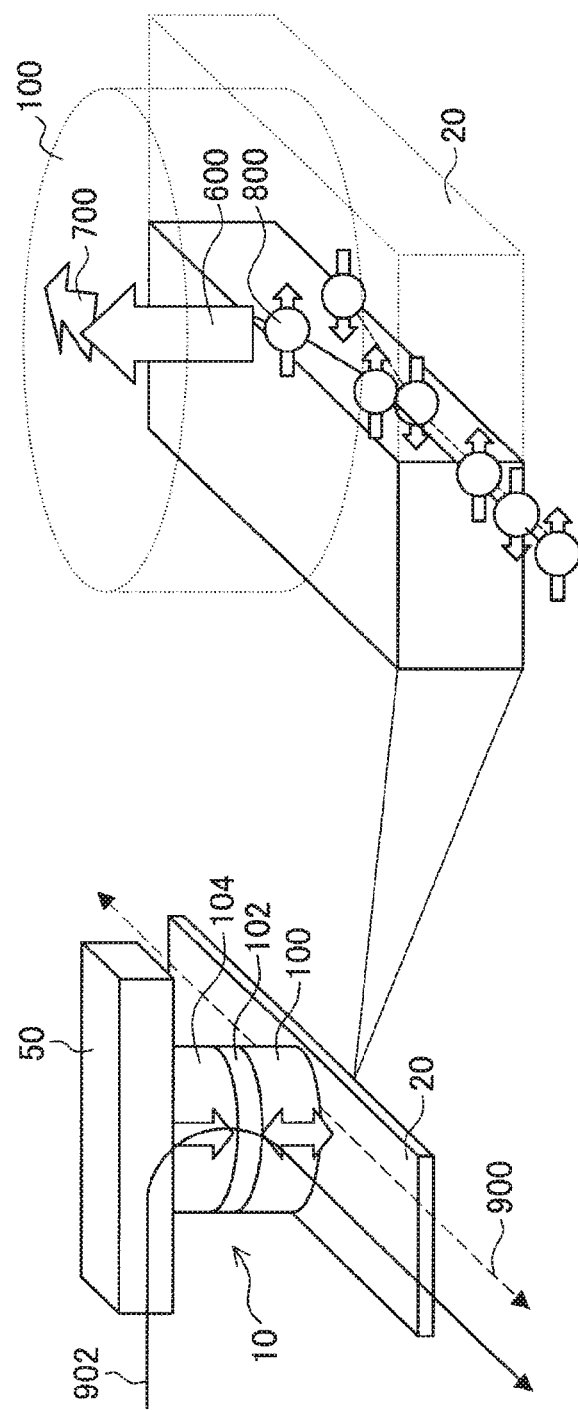
FIG. 1 is an explanatory diagram for describing a structure and an operation of an SOT-MRAM.

Favorable embodiments of the present disclosure will be described in detail with reference to the appended drawings. Note that, in the present specification and drawings, redundant description of configuration elements having substantially the same functional configuration is omitted by providing the same sign.

Furthermore, in the present specification and drawings, a plurality of configuration elements having substantially the same or similar functional configurations may be distinguished by being denoted with different figures after the same reference numeral. Note that, in a case where there is no need to distinguish the plurality of configuration elements having substantially the same or similar functional configurations, only the same reference numeral will be given. Furthermore, similar configuration elements in different embodiments may be distinguished by being denoted with different alphabets after the same reference numeral. Note that, in a case where there is no need to distinguish the similar configuration elements, only the same reference numeral will be given.

Then, the drawings to be referred in the following description are drawings for prompting description and understanding of an embodiment of the present disclosure, and shapes, dimensions, ratios, and the like illustrated in the drawings may be different from actual shapes. Moreover, magnetic memories and the like illustrated in the drawings can be appropriately changed in design in consideration of the description below and known technologies. Furthermore, in the following description, an up-down direction of a laminated structure of a magnetic memory element and the like may correspond to a relative direction in a case where a surface on a substrate where the magnetic memory element is provided faces an up direction and may be different from an up-down direction according to actual gravity acceleration.

Moreover, in the following description, terms such as a "perpendicular direction" (a direction perpendicular to a film surface) and an "in-plane direction" (a direction parallel to a film surface) are used for convenience when describing a magnetization direction (magnetic moment) and magnetic anisotropy. Note that these terms do not necessarily mean strict directions of magnetization. For example, words such as "the magnetization direction being the perpendicular direction" or "having the perpendicular magnetic anisotropy" mean that magnetization in the perpendicular direction is in a superior state to magnetization in the in-plane direction. Similarly, words such as "the magnetization direction being the in-pane direction" or "having in-plane magnetic anisotropy" means that the magnetization in the in-plane direction is superior to the magnetization in the perpendicular direction.

Note that the description will be given in the following order.

1. Outline of SOT-MRAM
  1.1. Outline of SOT-MRAM
  1.2. Structure of SOT-MRAM
  1.3. Operation of SOT-MRAM
2. Background of Technology of Present Disclosure
  2.1. Background of Technology of Present Disclosure
  2.2. Phenomenon in Which Magnetic Anisotropy and Magnetic Damping Constant of Magnetic Layer 100 Change by Voltage
3. Embodiment of Present Disclosure
  3.1. Basic Structure of Magnetic Memory 1
  3.2. Recording Method of Magnetic Memory 1
  3.3 Recording Method of Magnetic Memory 1 Including Plurality of Magnetic Memory Elements 10
  3.4. Method Manufacturing Magnetic Memory 1
4. Example
5. Conclusion
6. Supplement

1. OUTLINE OF SOT-MRAM

<1.1. Outline of SOT-MRAM>

An STT-MRAM is expected much because of capable of achieving lower power consumption and larger capacity using advantages such as high speed operation. For example, in such an STT-MRAM, an absolute value of a current required to cause spin torque magnetization inversion is 100 µA or less for a magnetic memory element on a scale of about 50 nm. However, to further advance a larger capacity in the MRAM, further reduction of an inversion current is required. Therefore, an SOT-MRAM is considered as one of methods.

As described above, a basic configuration of a magnetic memory element of the SOT-MRAM includes a spin orbit layer that provides spin orbit torque to a magnetic layer, a magnetic layer in which a magnetization direction is changed by the spin orbit torque provided from the spin orbit layer to record information, and a mechanism for reading information recorded in the magnetic layer. Specifically, the recording of information is performed such that spin-polarized electrons induced as a current flows in the spin orbit layer are injected into a magnetic layer where the magnetization direction is not fixed (this is also called spin injection torque) to provide spin torque to a magnetic moment of the magnetic layer to invert the magnetization direction of the magnetic layer. Therefore, the magnetization direction of the magnetic layer can be inverted by causing a current of a predetermined threshold or more to flow in the spin orbit layer. Note that recording of 1/0 of the magnetic memory element can be performed by changing a polarity of the current.

First, a structure of the SOT-MRAM and an operation of the SOT-MRAM will be described in detail with reference to FIG. 1. FIG. 1 is an explanatory diagram for describing the structure and operation of the SOT-MRAM. In detail, the left side in FIG. 1 illustrates a basic configuration of one magnetic memory element of the SOT-MRAM and the right side in FIG. 1 illustrates a state of electron spin and how spin torque works. Note that a circular column with the broken line illustrated on the left side in FIG. 1 illustrates a magnetic layer 100 of a magnetic memory element 10.

<1.2. Structure of SOT-MRAM>

First, the structure of the SOT-MRAM will be described with reference to FIG. 1. As illustrated on the left side in FIG. 1, the SOT-MRAM includes a spin orbit layer 20 extending in one direction, and a magnetic memory element 10 provided on the spin orbit layer 20. Furthermore, an electrode 50 is connected to a surface of the magnetic memory element 10, the surface facing a surface in contact with the spin orbit layer 20.

The spin orbit layer 20 provided to extend in one direction is formed by a thin metal material. The spin orbit layer 20 spin-polarizes electrons passing through the spin orbit layer 20 to generate spin-polarized electrons. The spin orbit layer 20 injects the generated spin-polarized electrons into the magnetic layer 100 described below of the magnetic memory element 10 to provide spin torque to a magnetic moment of the magnetic layer 100 and can invert the magnetization direction of the magnetic layer 100.

As illustrated in FIG. 1, the magnetic memory element 10 has a structure in which an insulating layer 102 is sandwiched between two magnetic layers 100 and 104, and is provided on the spin orbit layer 20. Specifically, the magnetic memory element 10 has a laminated structure in which the magnetic layer 100 as a recording layer in which the magnetization direction is changed from a side in contact with the spin orbit layer 20 to record information, the insulating layer 102, and the magnetic layer 104 as a reference layer in which the magnetization direction is fixed are sequentially laminated. Note that the magnetic layer 104 as a reference layer functions as part of a mechanism for reading information from the magnetic layer 100 as a recording layer.

In other words, the magnetic memory element 10 may be a so-called tunnel junction element. Specifically, in a case where a voltage is applied between the magnetic layers 100 and 104, the magnetic memory element 10 can cause a tunnel current to flow in the insulating layer 102 by the tunnel magnetoresistance effect. At this time, an electrical resistance of the insulating layer 102 changes depending on whether the magnetization directions of the magnetic layer 100 and the magnetic layer 104 are parallel or antiparallel. Furthermore, since the magnetization direction of the magnetic layer 100 in contact with the spin orbit layer 20 can be controlled by the spin-polarized electrons injected from the spin orbit layer 20, the magnetic memory element 10 can record information according to a relative angle between the magnetization direction of the magnetic layer 100 and the magnetic layer 104.

The electrode 50 is electrically connected to the magnetic memory element 10, and causes a current to flow in the magnetic memory element 10 when information is read from the magnetic memory element 10.

In other words, it can be said that, in the magnetic memory element 10 of the SOT-MRAM, the magnetic layer 100 is a region functioning to record information, and the insulating layer 102 and the magnetic layer 104 are regions functioning as a mechanism for reading information recorded in the magnetic layer 100.

<1.3. Operation of SOT-MRAM>

Next, a recording operation of information to and a reading operation of information from the above-described SOT-MRAM will be described.

(Recording Operation)

As illustrated on the left side in FIG. 1, in the case of recording information to the magnetic memory element 10 of the SOT-MRAM, a current flows in the spin orbit layer 20 along an arrow 900 indicating the direction in which the spin orbit layer 20 extends. Note that the direction of the current may be one direction or a reverse direction.

The electrons having passed through the spin orbit layer 20 are polarized in different spin directions above and below the spin orbit layer 20, as illustrated on the right side in FIG. 1. Then, a spin-polarized electron 800 polarized on the spin orbit layer 20 is injected into the magnetic layer 100 of the magnetic memory element 10. Therefore, in the magnetic layer 100, a magnetic moment (magnetization direction) 600 of the magnetic layer 100 receives spin torque 700 by the injected spin-polarized electron 800. Therefore, in a case where the spin torque 700 received from the spin-polarized electron 800 exceeds a threshold, the magnetic moment 600 of the magnetic layer 100 starts precession and is inverted. Thus, in the SOT-MRAM, the magnetization direction of the magnetic layer 100 is inverted by the spin orbit interaction between the spin orbit layer 20 and the magnetic layer 100 of the magnetic memory element 10, and information can be recorded in the magnetic layer 100.

(Reading Operation)

Furthermore, as illustrated on the left side in FIG. 1, a current flows in a laminating direction of the magnetic memory element 10 in the case of reading information from the magnetic memory element 10 of the SOT-MRAM. Specifically, the current passes through the magnetic memory element 10 and flows in the spin orbit layer 20 from the electrode 50 in a direction illustrated by an arrow 902. Note that the direction of the current may be one direction or a reverse direction.

In the magnetic memory element 10, the electric resistance of the insulating layer 102 changes by the tunnel magnetoresistance effect on the basis of whether the magnetization directions of the magnetic layers 100 and 104 sandwiching the insulating layer 102 are parallel or antiparallel. Therefore, in the SOT-MRAM, the magnetization direction of the magnetic layer 100 can be detected by measuring the electric resistance of the magnetic memory element 10. Therefore, in the SOT-MRAM, the magnetization direction of the magnetic layer 100 can be detected by detecting the electric resistance of the magnetic memory element 10, and information can be read from the magnetic layer 100 on the basis of a result of the detection.

Moreover, in a case of using a perpendicular magnetization film as the magnetic layer 100, the spin torque 700 is provided to the magnetic moment of the magnetic layer 100 without waste because the direction of the spin of the spin-polarized electron 800 is orthogonal to the magnetization direction of the magnetic layer 100, as illustrated on the right side in FIG. 1. Therefore, the SOT-MRAM has characteristics that an inversion speed is as fast as 1 nsec or less, for example, and an inversion current is small. Furthermore, as understood from the above description, in the SOT-MRAM, paths of current at the time of recording and at the time of reading of information are different from each other.

2. BACKGROUND OF TECHNOLOGY OF PRESENT DISCLOSURE

<2.1. Background of Technology of Present Disclosure>

Incidentally, as described above, the magnetic layer 100 of the magnetic memory element 10 of the SOT-MRAM can be formed by either an in-plane magnetization film or a perpendicular magnetization film. However, to further increase recording density, it is favorable to make the shape of the magnetic memory element 10 be a shape that looks like a circular shape as viewed from above the substrate, and to use, as the magnetic layer 100, a perpendicular magnetization film from which strong anisotropy can be obtained in the magnetic memory element 10 having the above shape.

However, in the case of using the perpendicular magnetization film as the magnetic layer 100, a force to rotate the magnetization direction of the magnetic layer 100 continues to act on the magnetic layer 100 while a current flows in the spin orbit layer 20. Therefore, to stably invert the magnetization direction of the magnetic layer 100 in a desired direction, strict control of a current value of the current to flow in the spin orbit layer 20 and a time width (pulse width) in which the current flows is required.

Furthermore, in the magnetic memory in which a plurality of the magnetic memory elements 10 is integrated, characteristics of the magnetic memory elements 10 vary due to manufacturing variations. Therefore, optimum values of the current value and the pulse width of the current for stably inverting the magnetization direction of the magnetic layer 100 of each magnetic memory element 10 in a desired direction are different in each magnetic memory element 10 Given this situation, uniformly inverting the magnetization directions of the magnetic layers 100 of the plurality of magnetic memory elements 10 included in one magnetic memory is difficult. As a result, achievement of a larger capacity of the magnetic memory has limitations. Furthermore, since the optimum values change according to the temperature or the like of an environment where the magnetic memory is used, favorable control of the current value and the pulse width is difficult in actually using the magnetic memory. Therefore, suppression of occurrence of an inversion error in which the magnetic layer 100 of the magnetic memory element 10 is not inverted as desired or is unintentionally inverted is difficult.

Furthermore, even in a case where the current can be provided to the magnetic memory element 10 with the optimum current value and pulse width and the magnetization direction of the magnetic layer 100 can be inverted, the magnetization direction of the magnetic layer 100 is not immediately stable. Then, an inversion error to return an inversion direction of the magnetic layer 100 may occur due to thermal fluctuation or the like.

Figure 2:
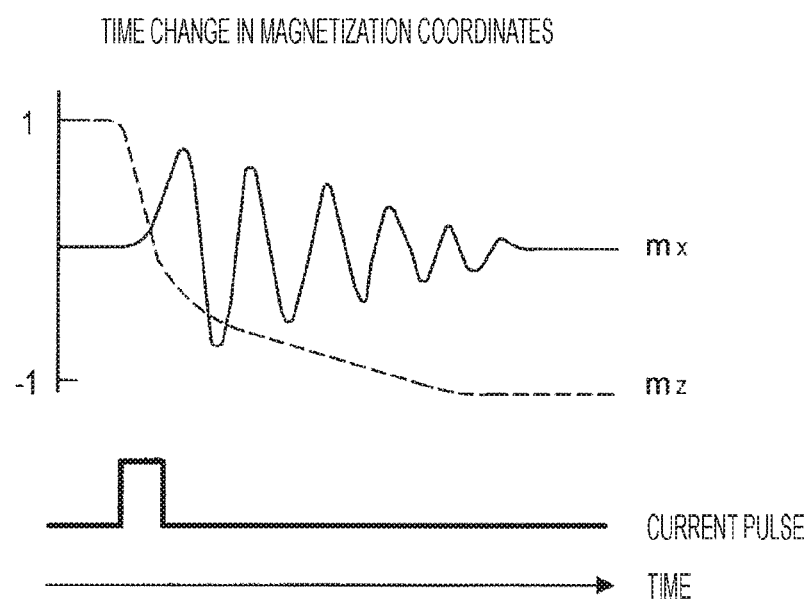
FIG. 2 illustrates an example of time change in a magnetization direction of a magnetic layer 100 after a pulse current is applied to a spin orbit layer.

Moreover, inversion of the magnetization direction of the magnetic layer 100 will be described with reference to FIG. 2. FIG. 2 illustrates an example of time change in the magnetization direction of the magnetic layer 100 after the pulse current is applied to the spin orbit layer. Specifically, FIG. 2 illustrates time change of a magnetization coordinate (mx) in an in-plane X-axis direction and a magnetization coordinate (mz) in a perpendicular Z-axis direction of the magnetization direction of the magnetic layer 100 in a sample in which the magnetic layer 100 is laminated on the spin orbit layer 20, and illustrates an application pattern of a current pulse to be given to the spin orbit layer 20 in a lower part.

As illustrated in FIG. 2, the magnetization direction of the magnetic layer 100 is inverted in a very short time (1 nanosecond or less) by the spin torque given from the spin orbit layer 20 given the pulse current (mz in FIG. 2). However, the magnetization direction of the magnetic layer 100 continues precession for a while (several nanoseconds to several tens of nanoseconds) due to a reaction of the inversion after the magnetization inversion (mx in FIG. 2). Moreover, during the precession, energy is higher than a stable state. Therefore, the magnetization direction of the magnetic layer 100 may return from an inverted state to a state before the inversion under an influence of thermal fluctuation or the like.

Therefore, to avoid return of the magnetization direction as described above and to stably invert the magnetization direction of the magnetic layer 100, use of an external magnetic field and a spin transfer torque together is conceivable. However, according to these methods, power consumption of the magnetic memory may be increased, and furthermore, coercive force characteristics of the magnetic memory element 10 may be deteriorated.

In view of the foregoing, the present inventors have intensively studied about an SOT-MRAM that can realize stable magnetization inversion while suppressing occurrence of an inversion error. While conducting the study, the present inventors have focused on a phenomenon that magnetic anisotropy and a magnetic damping constant of the magnetic layer 100 change by a voltage to be described below and have led to creation of an embodiment of the present disclosure. Hereinafter, the phenomenon that the present inventors have focused on will be described.

<2.2. Phenomenon in which Magnetic Anisotropy and Magnetic Damping Constant of Magnetic Layer 100 Change by Voltage>

By the way, it is known that, when a voltage is applied to a ferromagnetic body via an insulator, the magnetic anisotropy of the ferromagnetic body change by the applied voltage (see Non-Patent Document 2).

Moreover, as the present inventors have conducted the study, it is found that the magnetic damping constant of the ferromagnetic body changes in addition to the change in the magnetic anisotropy by applying the voltage to the ferromagnetic body as described above. Therefore, the present inventors have considered that stable magnetization inversion can be obtained by changing, by the voltage application, the magnetic anisotropy and the magnetic damping constant involved in the inversion of the magnetization direction by spin torque. Note that the magnetic damping constant here refers to a damping constant or the like that indicates friction of a magnetization motion, and indicates that the smaller the magnetic damping constant, the easier the inversion of the magnetization direction.

Figure 3:
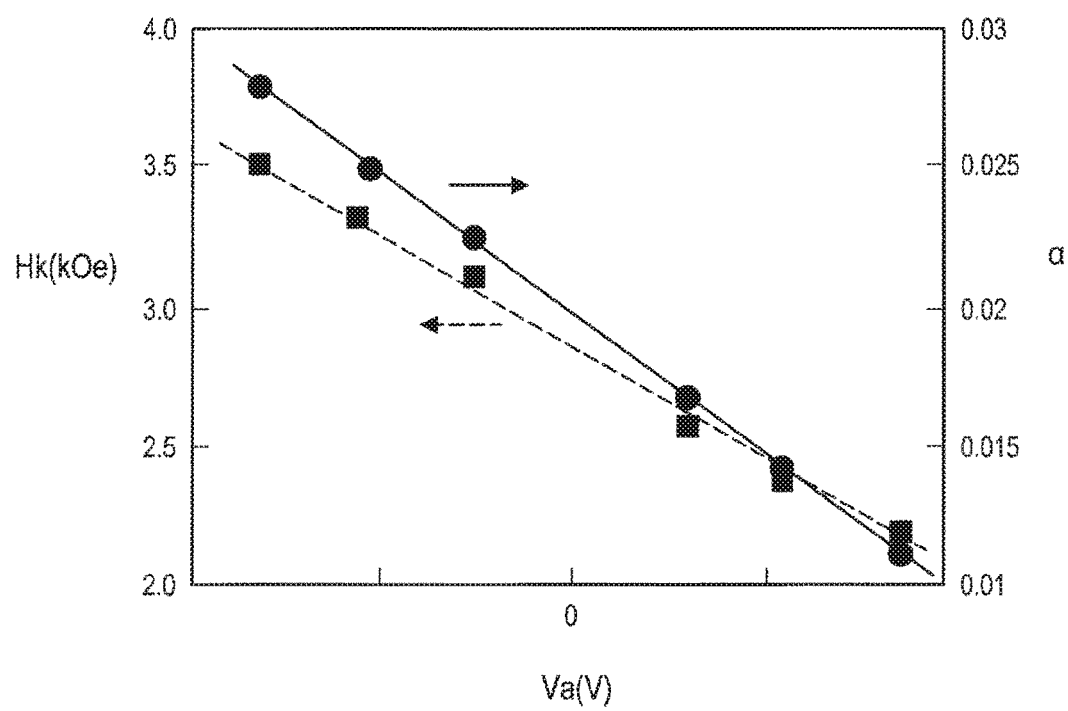
FIG. 3 illustrates an example of change in perpendicular magnetic anisotropy (Hk) and a magnetic damping constant (a) of the magnetic layer by a voltage.

Therefore, the present inventors have studied about change in perpendicular magnetic anisotropy (Hk) and a magnetic damping constant ($\alpha$) by voltage application in the magnetic memory element. Here, the magnetic memory element to be a sample has a laminated structure in which a CoFeB film (corresponding to the magnetic layer 100) with the film thickness of 1.2 nm, a MgO film with the film thickness of 2 nm, a CoFe film with the film thickness of 3 nm, an Ru film with the film thickness of 0.8 nm, and a CoFe film with the film thickness of 3 nm, and a protective film containing Ru are sequentially laminated on a base film containing Ta. Note that the CoFeB film becomes a perpendicular magnetization film by interface anisotropy with MgO, and the CoFe film is an in-plane magnetization film. Furthermore, the perpendicular magnetic anisotropy (Hk) and the magnetic damping constant ($\alpha$) of the CoFeB film have been obtained from a ferromagnetic resonance signal. FIG. 3 illustrates an example of change in the perpendicular magnetic anisotropy (Hk) and the magnetic damping constant ($\alpha$) of the CoFeB film (magnetic layer 100) by voltage application. In FIG. 3, the horizontal axis represents a voltage Va to be applied, the left vertical axis represents the perpendicular magnetic anisotropy (Hk), and the right vertical axis represents the magnetic damping constant ($\alpha$). Note that the voltage to be applied is illustrated such that a case in which a voltage of an electrode provided above a magnetic memory cell is higher than a voltage of an electrode provided below the magnetic memory cell becomes a positive direction.

As illustrated in FIG. 3, it is found that the perpendicular magnetic anisotropy (Hk) and the magnetic damping constant ($\alpha$) of the CoFeB film (magnetic layer 100) of the magnetic memory element change according to the applied voltage. Specifically, in a case where the voltage is applied in the positive direction, the perpendicular magnetic anisotropy (Hk) and the magnetic control constant ($\alpha$) decrease. Furthermore, in a case where the voltage is applied in a negative direction, the perpendicular magnetic anisotropy (Hk) and the magnetic control constant ($\alpha$) increase.

Therefore, from the study results, the present inventors have considered that the magnetization direction can be easily inverted because the perpendicular magnetic anisotropy and the magnetic control constant decrease by applying the voltage in the positive direction. Furthermore, the present inventors have considered that fluctuation (precession) of the magnetization direction is made small and the possibility of returning from the inverted state to the state before the inversion under the influence of thermal fluctuation or the like can be suppressed to be small because the perpendicular magnetic anisotropy and the magnetic control constant increase by applying the voltage in the negative direction.

Therefore, the present inventors have led to creation of an embodiment of the present disclosure capable of realizing the stable magnetization inversion while suppressing occurrence of an inversion error, using control of magnetic anisotropy and a magnetic damping constant by such voltage application. Hereinafter, such an embodiment of the present disclosure will be described in detail.

3. EMBODIMENT OF PRESENT DISCLOSURE

<3.1. Basic Structure of Magnetic Memory 1>

Figure 4:
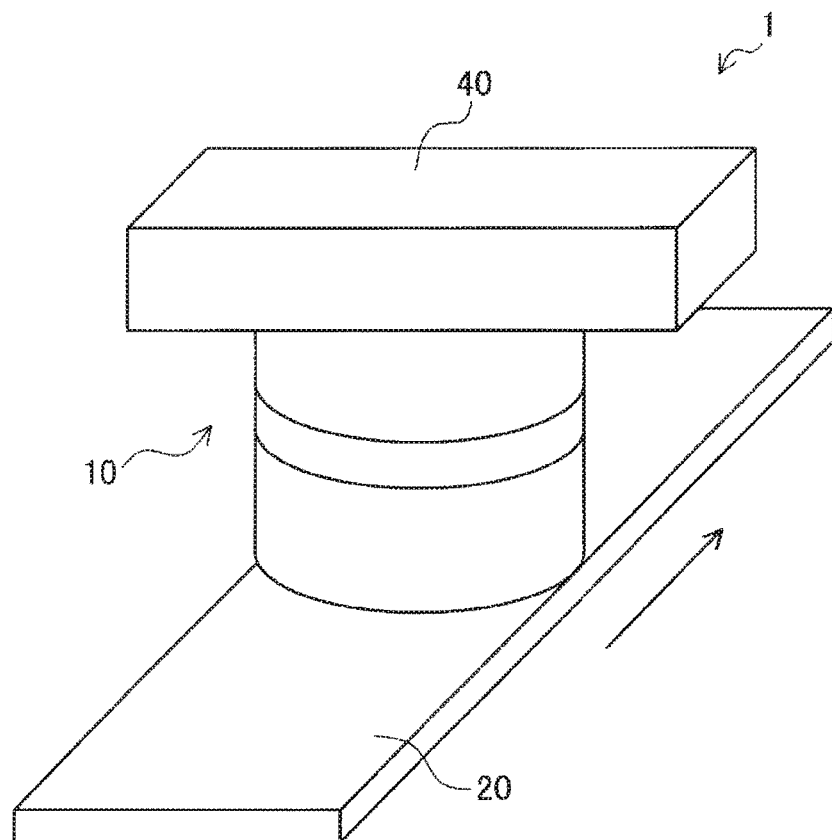
FIG. 4 is a perspective view schematically illustrating a structure of a magnetic memory 1 according to an embodiment of the present disclosure.
Figure 5:
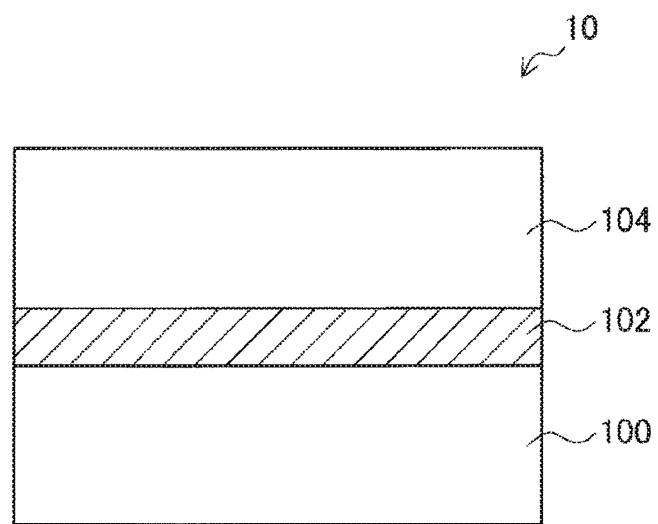
FIG. 5 is a cross-sectional view schematically illustrating the structure of the magnetic memory element 10 according to an embodiment of the present disclosure.

First, a basic structure of the magnetic memory 1 according to the present embodiment will be described with reference to FIGS. 4 and 5. FIG. 4 is a perspective view schematically illustrating a structure of the magnetic memory 1 according to the present embodiment, and FIG. 5 is a cross-sectional view schematically illustrating the structure of the magnetic memory element 10 according to the present embodiment.

As illustrated in FIG. 4, the basic structure of the magnetic memory 1 according to the present embodiment includes the spin orbit layer 20, the magnetic memory element 10 provided on the spin orbit layer 20, and an electrode layer (voltage application layer) 40 provided on the magnetic memory element 10. Furthermore, as illustrated in FIG. 5, the magnetic memory element 10 includes the magnetic layer 100 provided on the spin orbit layer 20 and the insulating layer 102 provided on the magnetic layer 100. Furthermore, the magnetic layer (another magnetic layer) 104 is provided under the electrode layer 40, as part of the mechanism for reading information of the magnetic memory element 10.

As described above, the spin orbit layer 20 spin-polarizes the electrons passing through the spin orbit layer 20 to generate the spin-polarized electrons, and injects the generated spin-polarized electrons into the magnetic layer 100.

The spin orbit layer 20 is formed by a conductive material that is thin enough to cause electrons passing therethrough to generate spin polarization. Therefore, the spin orbit layer 20 is favorably formed by a conductive material having high spin polarization efficiency, and is favorably formed by at least one or more types of conductive materials selected from a group consisting of Al, Ti, V, Cr, Mn, Cu, Zn, Ag, Hf, Ta, W, Re, Pt, Au, Hg, Pb, Si, Ga, GaMn, and GaAs. Moreover, at least one or more types of elements selected from a group consisting of Y, Zr, Nb, Mo, Tc, Ru, Rh, Pd, Cd, In, Sb, Te, Hf, Ta, W, Re, Os, Ir, Pt, Ag, Au, Hg, Tl, Pb, Bi, Po, At, V, Cr, Mn, Fe, Co, Ni, P, S, Zn, Ga, Ge, As, Se, I, Lu, La, Ce, Pr, Nd, Pm, Sm, Eu, Gd, Tb, Dy, Ho, Er, Tm, and Yb may be added to the spin orbit layer 20. Moreover, an underlayer (not illustrated) may be provided below the spin orbit layer 20 to control the orientation of the spin orbit layer 20.

The magnetic layer 100 is formed by a ferromagnetic material and provided on the spin orbit layer 20. The magnetization direction of the magnetic layer 100 is not fixed and changes according to information to be recorded. Specifically, the magnetic layer 100 is provided to be invertible such that the magnetization direction becomes either parallel or antiparallel to the magnetization direction of the magnetic layer 104 to be described below. Furthermore, a metal layer (not illustrated) or a thin insulating layer (not illustrated) may be provided between the magnetic layer 100 and the spin orbit layer 20.

The magnetic layer 100 is favorably formed by, for example, a ferromagnetic material having a composition of a combination of a plurality of elements selected from a group consisting of Co, Fe, B, Al, Si, Mn, Ga, Ge, Ni, Cr, and V. Furthermore, the magnetic layer 100 may be formed as a single layer or may be formed as a laminate of an insulating layer and a magnetic layer.

The insulating layer 102 is formed by an insulator material and provided on the magnetic layer 100. Note that the insulating layer 102 is sandwiched between the magnetic layer 100 and the magnetic layer 104 to be described below, so that the magnetic memory element 10 can function as a tunnel junction element exhibiting the tunnel magnetoresistance effect.

The insulating layer 102 can be formed by, for example, various insulators such as MgO, $Al_2O_3$, $SiO_2$, $SrTiO_2$, and $AlLaO_3$. Furthermore, in the case of forming the insulating layer 102 with MgO, a magnetic resistance change ratio (in other words, an MR ratio) of the magnetic memory element 10 as the tunnel junction element can be made higher. Therefore, it is favorable to form the insulating layer 102 with MgO.

The magnetic layer 104 is formed by a ferromagnetic material and provided on the insulating layer 102. The magnetization direction of the magnetic layer 104 is fixed in a predetermined direction as a reference with respect to the magnetization direction of the magnetic layer 100. Since the magnetic layer 104 serves as a reference of information recorded in the magnetic memory element 10, the magnetic layer 104 is favorably formed by a ferromagnetic material with the magnetization direction that less easily changes. For example, the magnetic layer 104 may be formed by a ferromagnetic material having a large coercive force or a large magnetic damping constant. Furthermore, the magnetic layer 104 may be formed to have a large thickness to make the magnetization direction less easily change.

For example, the magnetic layer 104 is favorably formed by a ferromagnetic material having a composition of a combination of a plurality of elements selected from a group consisting of Co, Fe, B, Al, Si, Mn, Ga, Ge, Ni, Cr, and V. Note that the magnetic layer 104 may be formed as a single layer or may be formed as a laminate of an insulating layer and a magnetic layer.

The electrode layer 40 is an electrode that applies a voltage to the magnetic layer 100 via the insulating layer 102 and is provided above the insulating layer 102, in other words, on the magnetic layer 104. Furthermore, the electrode layer 40 is formed by a nonmagnetic metal material or a magnetic metal material. Note that formation of the electrode layer 40 from a magnetic metal can omit formation of the above-described magnetic layer 104. In doing so, a ferromagnetic tunnel junction can be formed between the electrode layer 40 and the magnetic layer 100. Therefore, the magnetic memory element 10 can be caused to function as the tunnel junction element exhibiting the tunnel magnetoresistance effect. Therefore, by using the electrode layer 40, not only the voltage is applied to the magnetic layer 100 but also information can be read from the magnetic memory element 10.

Furthermore, since the magnitude of the change rate of the perpendicular magnetic anisotropy and the magnetic damping constant of the magnetic layer 100 due to the voltage changes according to the configuration of the magnetic memory element 10 including polarity, it is favorable to select the material and film thickness of each layer of the magnetic memory element 10 to make the change rate large. Furthermore, similarly, it is favorable to select the size, shape, and the like of the magnetic memory element 10 to make the change rate large. Moreover, since the magnitude of the change rate of the perpendicular magnetic anisotropy of the magnetic layer 100 due to the voltage changes according to the interface state between the magnetic layer 100 and the insulating layer 102, it is favorable to select the material, processing, and the like of the magnetic layer 100 and the insulating layer 102 to make the change rate large. Similarly, it is favorable to select the underlayer provided under the magnetic layer 100 to make the change rate large.

Note that the magnetic memory 1 may include a plurality of the basic structures in FIG. 4. In this case, a plurality of the magnetic memory elements 10 is provided along an extending direction (first direction) of the spin orbit layer 20 on one spin orbit layer 20. Moreover, the electrode layer 40 corresponding to the magnetic layer 100 of each magnetic memory element 10 is provided on the each magnetic memory element 10 in order to apply the voltage. For example, a plurality of the electrode layers 40 extends along a direction (second direction) orthogonal to the extending direction of the spin orbit layer 20 (see FIG. 8).

Furthermore, the magnetic memory 1 may have the following structure. For example, the magnetic memory 1 includes a plurality of the magnetic memory elements 10 arranged on a substrate in a matrix manner. Moreover, in the magnetic memory 1, the plurality of spin orbit layers 20 is provided to extend along the first direction as spin orbit layers common to magnetic memory element columns each including the plurality of magnetic memory elements 10 and arranged along the first direction. Furthermore, the plurality of electrode layers 40 is provided to extend along the second direction as metal layers common to magnetic memory element rows each including the plurality of magnetic memory elements 10 and arranged along the second direction (see FIG. 10).

As described above, by providing the plurality of magnetic memory elements 10 on one spin orbit layer 20, the magnetic memory 1 provided with the high-density magnetic memory elements 10 can be realized.

Figure 8:
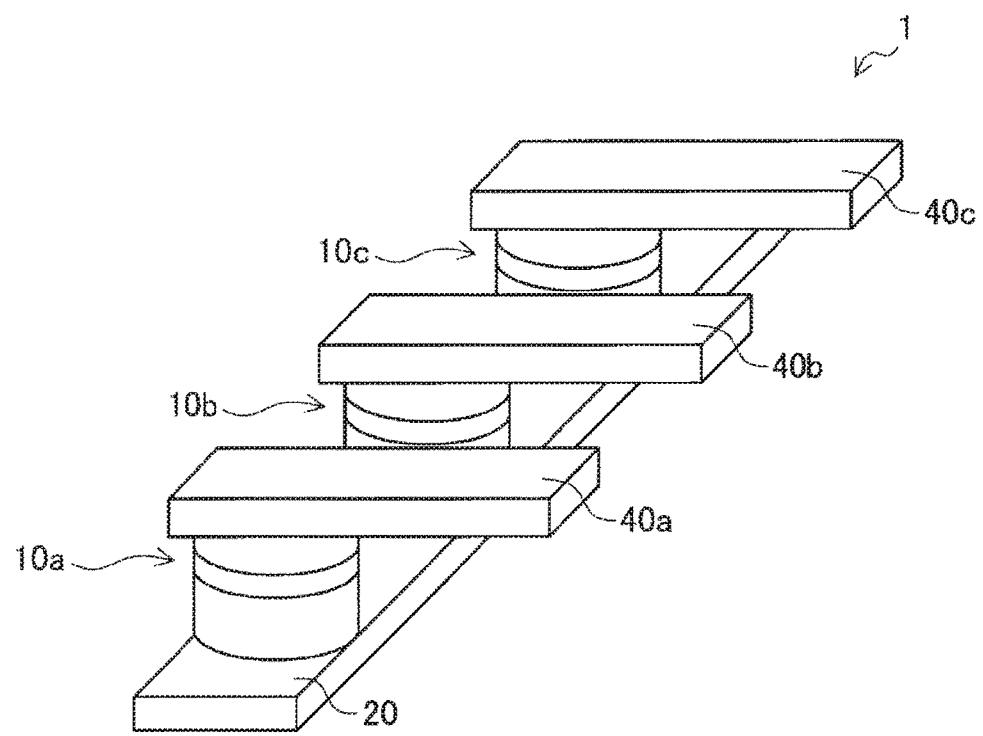
FIG. 8 is a perspective view (No. 1) schematically illustrating a structure of the magnetic memory 1 including the magnetic memory element 10 according to an embodiment of the present disclosure.
Figure 10:
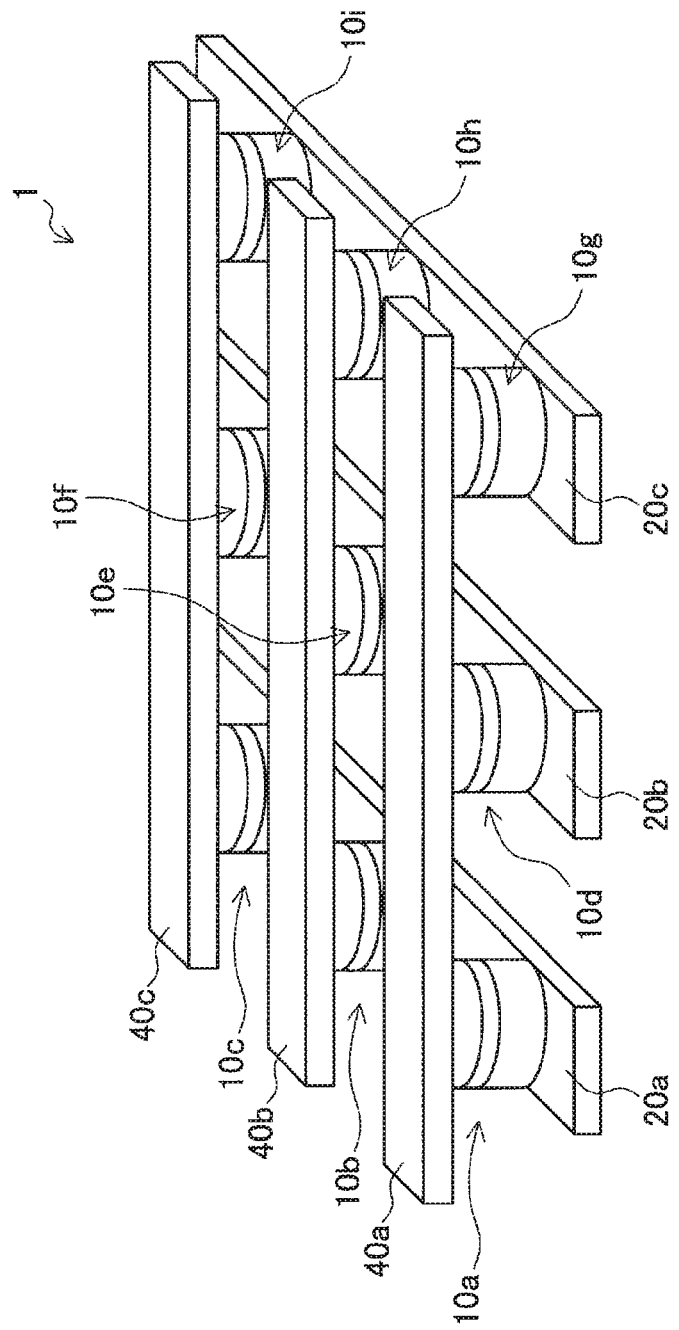
FIG. 10 is a perspective view (No. 2) schematically illustrating a structure of the magnetic memory 1 including the magnetic memory element 10 according to an embodiment of the present disclosure.

Note that, in the present embodiment, the structure of the magnetic memory 1 is not limited to the structure illustrated in FIGS. 8 and 10. The magnetic memory 1 according to the present embodiment may include a large number of the magnetic memory elements 10.

<3.2. Recording Method of Magnetic Memory 1>

Figure 6:
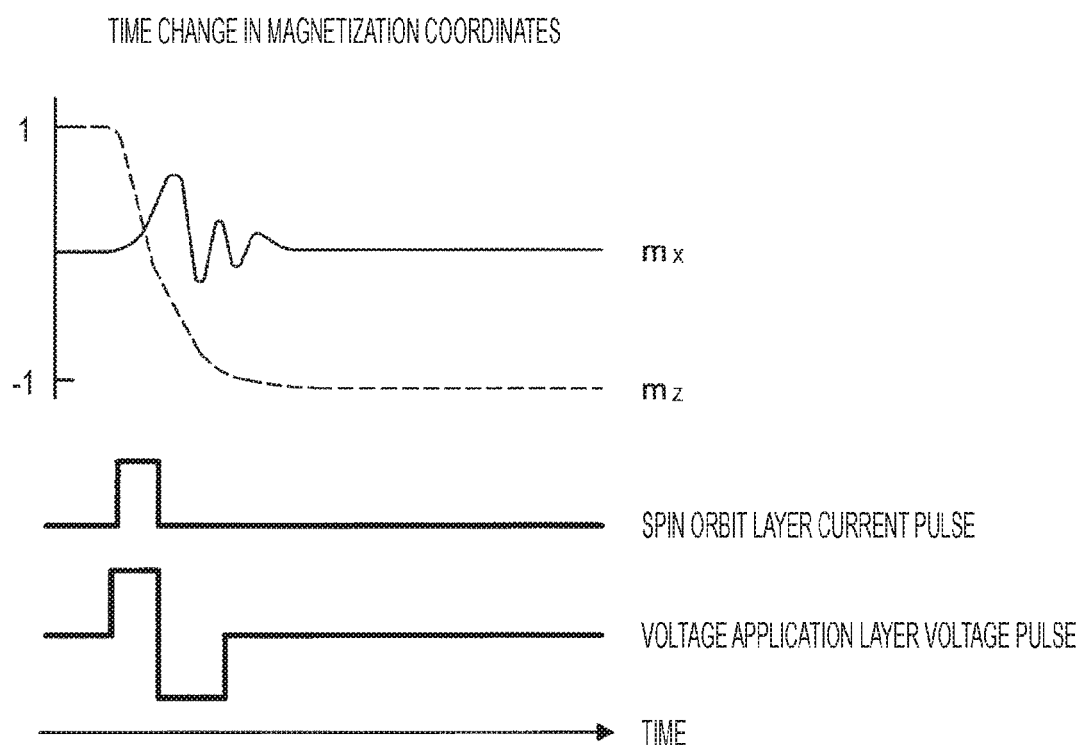
FIG. 6 is an explanatory diagram for describing a recording method of the magnetic memory 1 illustrated in FIG. 4.

Next, a recording method in the magnetic memory 1 according to the present embodiment illustrated in FIG. 4 will be described with reference to FIG. 6. FIG. 6 is an explanatory diagram for describing the recording method of the magnetic memory 1 illustrated in FIG. 4. Specifically, the lower side in FIG. 6 illustrates application patterns of a pulse current to be given to the spin orbit layer 20 of the magnetic memory element 10 and a pulse voltage to be given to the electrode layer 40. Moreover, the upper side in FIG. 6 illustrates time change in the magnetization coordinate (mx) in the in-plane X-axis direction and the magnetization coordinate (mz) in the perpendicular direction (Z-axis direction) of the magnetic layer 100 of the magnetic memory element 10 in a case where the current and voltage having such application patterns are applied.

In the present embodiment, as illustrated on the lower side in FIG. 6, a voltage (first voltage) in the positive direction in which the electrode layer 40 side becomes higher than the lower electrode of the magnetic memory element 10 is applied to the magnetic layer 100 to lower the magnetic anisotropy and the magnetic damping constant of the magnetic layer 100, using the electrode layer 40, in recording.

Note that, in the following description, the direction of the voltage that lowers the magnetic anisotropy and the magnetic damping constant of the magnetic layer 100 will be referred to as inversion acceleration direction. Furthermore, at the same time, a pulse-like pulse current is caused to flow in the spin orbit layer 20. Moreover, a voltage (second voltage) in the negative direction in which the electrode layer 40 side becomes lower than the lower electrode of the magnetic memory element 10 is applied to the magnetic layer 100 to raise the magnetic anisotropy and the magnetic damping constant of the magnetic layer 100 behind the pulse current or after the pulse current decreases, using the electrode layer 40. Note that, in the following description, the direction of the voltage that raises the magnetic anisotropy and the magnetic damping constant of the magnetic layer 100 will be referred to as inversion suppression direction.

As illustrated on the upper side in FIG. 6, the magnetization direction of the magnetic layer 100 is more quickly inverted than the case in FIG. 2, by applying the voltage in the inversion acceleration direction to the magnetic layer 100 by the electrode layer 40 (mz in FIG. 6). Moreover, as illustrated on the upper side in FIG. 6, the precession after the magnetization inversion is quickly converged by applying the voltage in the inversion suppression direction to the magnetic layer 100 by the electrode layer 40 after the magnetization direction is inverted (mx in FIG. 6). Therefore, according to the present embodiment, the magnetization direction can be quickly inverted, and further, the fluctuation (precession) in the magnetization direction can be made small, and the possibility of returning from the inverted state to the state before inversion under the influence of thermal fluctuation or the like can be suppressed to be low. As a result, according to the present embodiment, the magnetization direction of the magnetic layer 100 of the magnetic memory element 10 can be stable inverted while suppressing occurrence of an inversion error.

Figure 7:
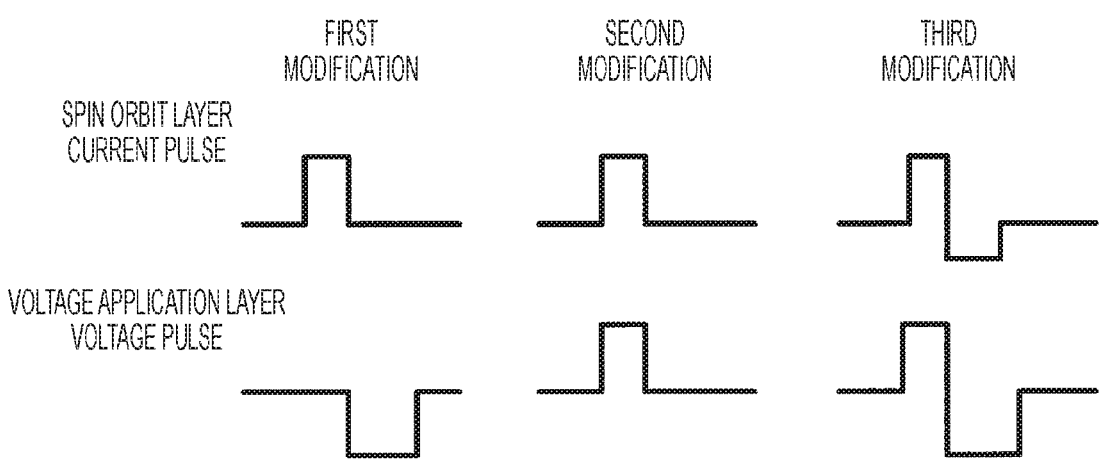
FIG. 7 is an explanatory diagram for describing modifications of the recording method of the magnetic memory 1 illustrated in FIG. 4.

Furthermore, the example illustrated in FIG. 6 is an example of the recording method according to the present embodiment, and the present embodiment may include other modifications. Hereinafter, first to third modifications of the recording method according to the present embodiment will be described with reference to FIG. 7. FIG. 7 is an explanatory diagram for describing modifications of the recording method of the magnetic memory 1 according to an embodiment of the present disclosure.

First Modification

In a first modification, as illustrated on the left side in FIG. 7, the pulse current flows in the spin orbit layer 20 in recording. Moreover, the voltage in the inversion suppression direction is applied to the magnetic layer 100 behind the pulse current or after the pulse current decreases, using the electrode layer 40. As described above, by applying the voltage (third voltage) in the inversion suppression direction to the magnetic layer 100 by the electrode layer 40, the precession after the magnetization inversion can be quickly converged.

Second Modification

In a second modification, as illustrated in the center in FIG. 7, the voltage in the inversion acceleration direction is applied to the magnetic layer 100 using the electrode layer 40 at the same time as application of a pulse current to the spin orbit layer 20, in recording. As described above, by applying the voltage in the inversion acceleration direction to the magnetic layer 100 by the electrode layer 40, the magnetization direction of the magnetic layer 100 can be quickly inverted.

Third Modification

In a third modification, as illustrated on the right side in FIG. 7, the voltage in the inversion acceleration direction is applied to the magnetic layer 100 using the electrode layer 40 at the same time as application of a pulse current to the spin orbit layer 20, in recording. Next, the voltage in the inversion suppression direction is applied to the magnetic layer 100 using the electrode layer 40 at the same time as flow of a pulse current in the negative direction having polarity opposite to the above-described pulse current into the spin orbit layer 20. As described above, by applying the pulse current to the spin orbit layer 20 and applying the voltage to the magnetic layer 100 by the electrode layer 40, the precession after the magnetization inversion can be quickly converged.

Note that the polarity of the applied current and voltage can be made opposite according to the structure, material, and the like of the magnetic memory element 10. Furthermore, the pulse shape of the applied current and voltage may be a square wave or a trapezoid or may have a certain overshoot.

<3.3 Recording Method of Magnetic Memory 1 Including Plurality of Magnetic Memory Elements 10>

The recording method described so far is a recording method in the magnetic memory 1 including one magnetic memory element 10. However, the magnetic memory 1 according to the present embodiment may include a plurality of the magnetic memory elements 10. Information can be selectively recorded to a desired magnetic memory element 10 by controlling the voltage to be applied to each magnetic memory element 10 with respect to such a magnetic memory 1. Therefore, a recording method of such a magnetic memory 1 will be described below.

(Recording Method 1)

Figure 9:
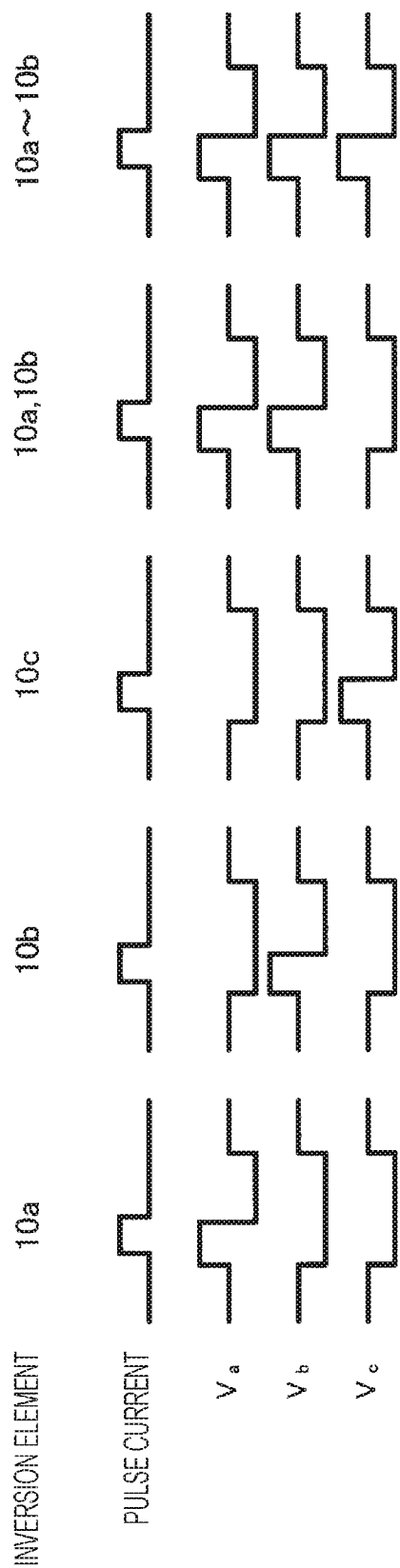
FIG. 9 is an explanatory diagram for describing a recording method of the magnetic memory 1 illustrated in FIG. 8.

A recording method of the magnetic memory 1 including a plurality of the magnetic memory elements 10 will be described with reference to FIGS. 8 and 9. FIG. 8 is a perspective view schematically illustrating a structure of the magnetic memory 1 including the magnetic memory element 10 according to the present embodiment, and FIG. 9 is an explanatory diagram for describing a recording method of the magnetic memory 1 illustrated in FIG. 8. Specifically, the upper side in FIG. 9 illustrates the magnetic memory elements 10 in which recording is performed, the middle part illustrates application patterns of the pulse current of the spin orbit layer 20, and the lower part illustrates application patterns of voltages Va, Vb, and Vc to be applied to the plurality of electrode layers 40a, 40b, and 40c (see FIG. 8).

First, as illustrated in FIG. 8, three magnetic memory elements 10a, 10b, and 10c are provided on one spin orbit layer 20 along the extending direction of the spin orbit layer 20. Furthermore, the electrode layers 40a, 40b, and 40c are respectively provided on the magnetic memory elements 10a, 10b, and 10c.

In the magnetic memory 1 illustrated in FIG. 8, in a case of performing recording on the magnetic memory element 10a only, a voltage (fourth voltage) in the inversion acceleration direction is applied to the magnetic layer 100 of the magnetic memory element 10a by the electrode layer 40a corresponding to the magnetic memory element 10a at the same time as application of the pulse current to the spin orbit layer 20, as illustrated on the left side in FIG. 9. Moreover, the voltage in the inversion suppression direction is applied to the magnetic layer 100 of the magnetic memory element 10a by the electrode layer 40a behind the pulse current or after the pulse current decreases. In doing so, the magnetization direction of the magnetic layer 100 of the magnetic memory element 10a can be quickly inverted, and further, the precession in the magnetization direction can be made small, and the possibility of returning from the inverted state to the state before inversion under the influence of thermal fluctuation or the like can be suppressed to be low. As a result, the magnetization direction of the magnetic layer 100 of the magnetic memory element 10a can be stably inverted.

Furthermore, as for the magnetic memory elements 10b and 10c on which recording is not performed, a voltage (fifth voltage) in the inversion suppression direction is applied to the magnetic layers 100 of the magnetic memory elements 10b and 10c using the corresponding electrode layers 40b and 40c while the voltage is applied to the electrode layer 40a. In doing so, even if spin torque is given to the magnetic layers 100 of the magnetic memory elements 10b and 10c, the magnetization direction of the magnetic layer 100 is less easily inverted by the voltage in the inversion suppression direction. Therefore, unintentionally recording information to the magnetic memory elements 10b and 10c can be prevented. In other words, according to the present embodiment, information can be selectively recorded on the desired magnetic memory element 10a only.

Note that, in a case of performing recording on the magnetic memory element 10b only, the magnetic memory element 10c only, the magnetic memory elements 10a and 10b only, and the magnetic memory elements 10a to 10c in FIG. 8, the voltage in the inversion acceleration direction and the voltage in the inversion acceleration direction are only required to be applied to the magnetic layers 100 of the magnetic memory elements 10a to 10c using the corresponding electrode layers 40a to 40c, similarly to the above description, as illustrated in FIG. 9. Note that the application pattern of the voltage in the present embodiment is not limited to the example illustrated in FIG. 9 and may be another example.

(Recording Method 2)

Figure 11:
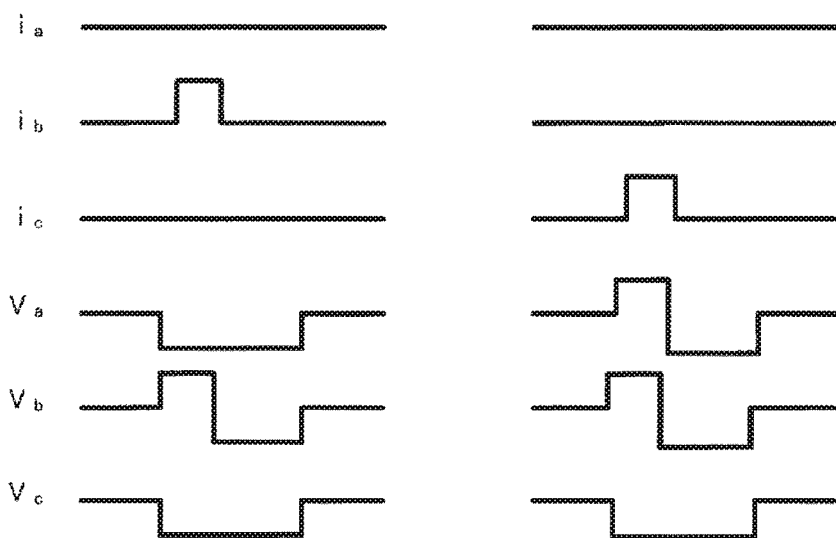
FIG. 11 is an explanatory diagram for describing a recording method of the magnetic memory 1 illustrated in FIG. 10.

The above-described magnetic memory 1 has one spin orbit layer 20, but the magnetic memory 1 according to the present embodiment may have a plurality of the spin orbit layers 20. Information can be selectively recorded to a desired magnetic memory element 10 by controlling the voltage to be applied to the magnetic memory element 10 with respect to such a magnetic memory 1. Therefore, a recording method of such a magnetic memory 1 will be described below with reference to FIGS. 10 and 11. FIG. 10 is a perspective view schematically illustrating a structure of the magnetic memory 1 including the magnetic memory element 10 according to the present embodiment, and FIG. 11 is an explanatory diagram for describing a recording method of the magnetic memory 1 illustrated in FIG. 10. More specifically, the upper side in FIG. 11 illustrates the magnetic memory elements 10 in which recording is performed, the middle part illustrates application patterns of pulse currents ia, ib, and is of spin orbit layers 20a, 20b and 20c, and the lower part illustrates application patterns of voltages Va, Vb, and Vc to be applied to the plurality of electrode layers 40a, 40b, and 40c (see FIG. 10).

First, as illustrated in FIG. 10, the magnetic memory 1 includes nine magnetic memory elements 10a to 10i provided on a substrate in a matrix manner. Furthermore, the magnetic memory 1 includes the spin orbit layer 20a common to a magnetic memory element column including the plurality of magnetic memory elements 10a to 10c, the spin orbit layer 20b common to a magnetic memory element column including the plurality of magnetic memory elements 10d to 10f, and the spin orbit layer 20c common to a magnetic memory element column including the plurality of magnetic memory elements 10g to 10i. Moreover, the magnetic memory 1 includes the electrode layer 40a common to a magnetic memory element row including the plurality of magnetic memory elements 10a, 10d, and 10g, the electrode layer 40b common to a magnetic memory element row including the plurality of magnetic memory elements 10b, 10e, and 10h, and the electrode layer 40c common to a magnetic memory element row including the plurality of magnetic memory elements 10c, 10f, and 10i.

In the magnetic memory 1 illustrated in FIG. 10, in the case of performing recording on the magnetic memory element 10e only, the pulse current is applied to the spin orbit layer 20b corresponding to the magnetic memory element 10e, and at the same time, the voltage in the inversion acceleration direction is applied to the magnetic layer 100 of the magnetic memory element 10e using the electrode layer 40b corresponding to the magnetic memory element 10e. Moreover, the voltage in the inversion suppression direction is applied to the magnetic layer 100 of the magnetic memory element 10e using the electrode layer 40b behind the pulse current or after the pulse current decreases. In doing so, the magnetization direction of the magnetic layer 100 of the magnetic memory element 10e can be quickly inverted, and further, the precession in the magnetization direction can be made small, and the possibility of returning from the inverted state to the state before inversion under the influence of thermal fluctuation or the like can be suppressed to be low. As a result, the magnetization direction of the magnetic layer 100 of the magnetic memory element 10e can be stably inverted.

Furthermore, as for the other magnetic memory elements 10a to 10d and 10f to 10i on which recording is not performed, the pulse current is not applied to the spin orbit layers 20a and 20c and furthermore, the voltage in the inversion suppression direction is applied to the magnetic layers 100 of the magnetic memory elements 10d and 10g using the electrode layers 40a and 40c, while the current and voltage are applied to the spin orbit layer 20b and the electrode layer 40a. In doing so, since spin torque is not given to the magnetic layers 100 of the magnetic memory elements 10a to 10c and 10g to 10i on the spin orbit layers 20a and 20b to which the current is not applied, the magnetization directions of these magnetic layers 100 are not inverted. Moreover, since the voltage in the inversion suppression direction is applied to the magnetic layers 100 of the magnetic memory elements 10d and 10g to which the spin torque is given by the spin orbit layer 20b, the magnetization directions of the magnetic layers 100 are not inverted. In other words, according to the present embodiment, information can be selectively recorded only to the desired magnetic memory element 10e.

Furthermore, in the case of performing recording on the magnetic memory elements 10g and 10h in FIG. 10 only, the current and voltage are only required to be applied to the spin orbit layer 20c and the electrode layers 40a to 40c, as illustrated on the right side in FIG. 11.

In other words, according to the present embodiment, by applying the pulse current to the corresponding spin orbit layer 20 and at the same time, by applying the voltage in the inversion acceleration direction by the corresponding electrode layer 40, recording can be performed on the desired magnetic memory element 10. Furthermore, as for the magnetic memory element 10 on which recording is not performed, erroneously recording information can be prevented by applying the voltage in the inversion suppression direction by the corresponding electrode layer 40.

Note that, when reading information from the magnetic memory 1 in FIG. 10, an operation to invert the magnetization directions of the magnetic layers 100 of all the magnetic memory elements 10 on the spin orbit layer 20 corresponding to the magnetic memory element 10 from which information is desired to be read in the magnetic memory 1 is performed, and resistance change in each magnetic memory element 10 is detected before and after the inversion. In this case, each magnetic memory element 10 can be returned to the original recording state (original magnetization direction) by performing the inversion operation again.

<3.4. Method Manufacturing Magnetic Memory 1>

Next, a method of manufacturing the magnetic memory 1 according to the embodiment of the present disclosure will be described with reference to FIGS. 12A, 12B, 13A, 13B, 14A, 14B, 15A, 15B, 16A, 16B, 17A, 17B, 18A, 18B, and 18C. Specifically, FIGS. 12A, 12B, 13A, 13B, 14A, 14B, 15A, 15B, 16A, 16B, 17A, 17B, and 18A are plan views for describing steps in a method of manufacturing the magnetic memory 1 according to an embodiment of the present disclosure, and FIGS. 12B, 13A, 13B, 14A, 14B, 15A, 15B, 16A, 16B, 17A, 17B, 18A, and 18B are cross-sectional views of B-B' section in the corresponding plan views. Furthermore, FIG. 18C is a cross-sectional view of C-C' section in the plan view in FIG. 18A.

Figure 12A:
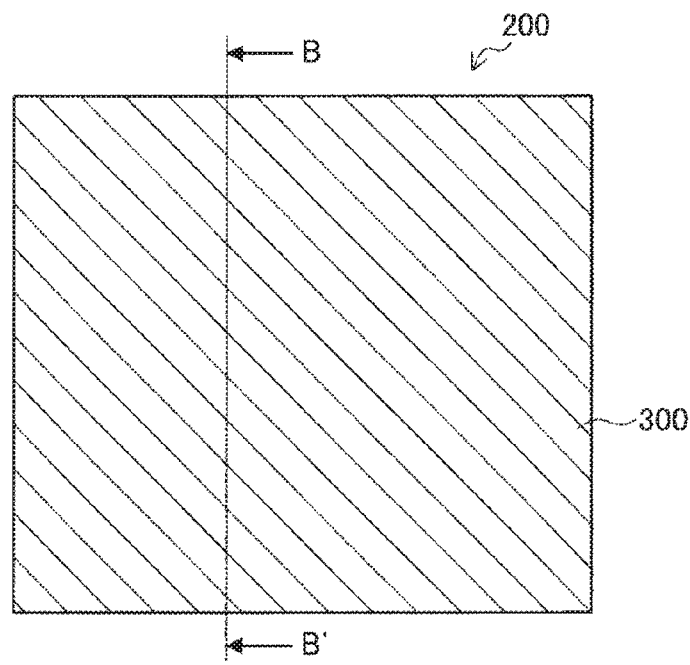
FIG. 12A is a plan view (No. 1) for describing steps in a method of manufacturing the magnetic memory 1 according to an embodiment of the present disclosure.
Figure 12B:
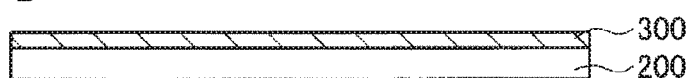
FIG. 12B is a cross-sectional view of a case of being cut along B-B' in FIG. 12A.

As illustrated in FIGS. 12A and 12B, a spin orbit layer 300 including a conductive material is formed on a substrate 200 on which electrodes (not illustrated), selection transistors (not illustrated), and the like are formed. In detail, for example, a W film with the thickness of 5 nm is formed as the spin orbit layer 300.

Figure 13A:
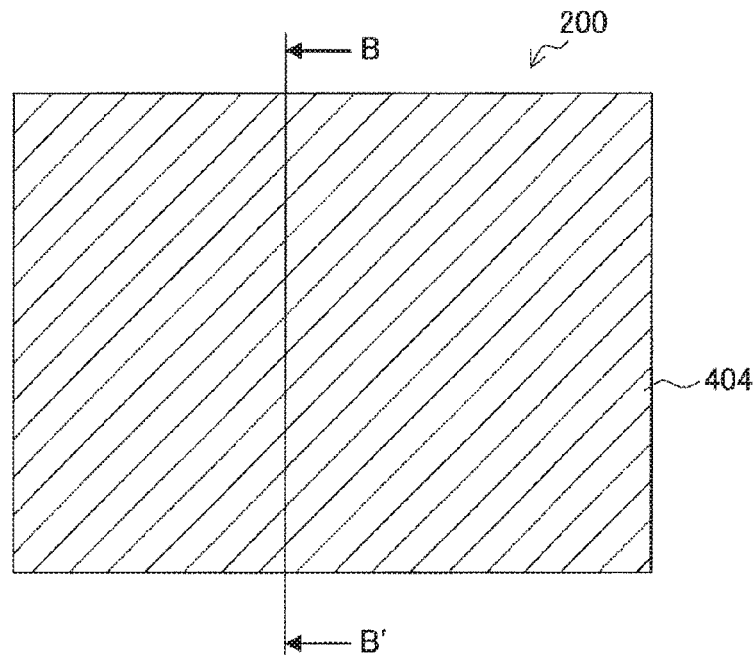
FIG. 13A is a plan view (No. 2) for describing steps in a method of manufacturing the magnetic memory 1 according to an embodiment of the present disclosure.
Figure 13B:
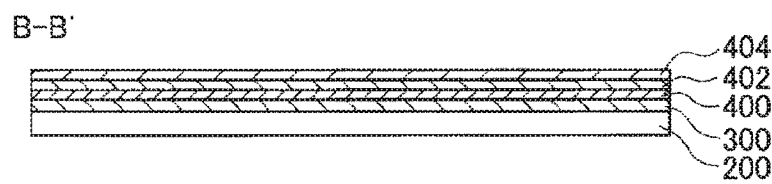
FIG. 13B is a cross-sectional view of a case of being cut along B-B' in FIG. 13A.

Next, as illustrated in FIGS. 13A and 13B, a magnetic layer 400, an insulating layer 402, and a magnetic layer 404 are laminated on the above-described substrate 200. Specifically, for example, as the magnetic layer 400, a laminated film including an FeCoB film with the film thickness of 1.2 nm, a Ta film with the film thickness of 0.2 nm, an FeCoB film with the film thickness of 0.8 nm, and an MgO film with the film thickness of 0.5 nm is formed. Note that the MgO film with the film thickness of 0.5 nm is a film for providing perpendicular magnetization to the magnetic layer 400. Furthermore, as the insulating layer 402, for example, an MgO film with the film thickness of 2 nm is formed. Furthermore, as the magnetic layer 404, for example, a laminated film including a Ta film with the film thickness of 2 nm, an Ru film with the film thickness of 5 nm, a CoPt film with the film thickness of 2 nm, an Ru film with the film thickness of 0.8 nm, a W film with the film thickness of 0.2 nm, and an FeCoB film with the film thickness of 1 nm is formed.

Figure 14A:
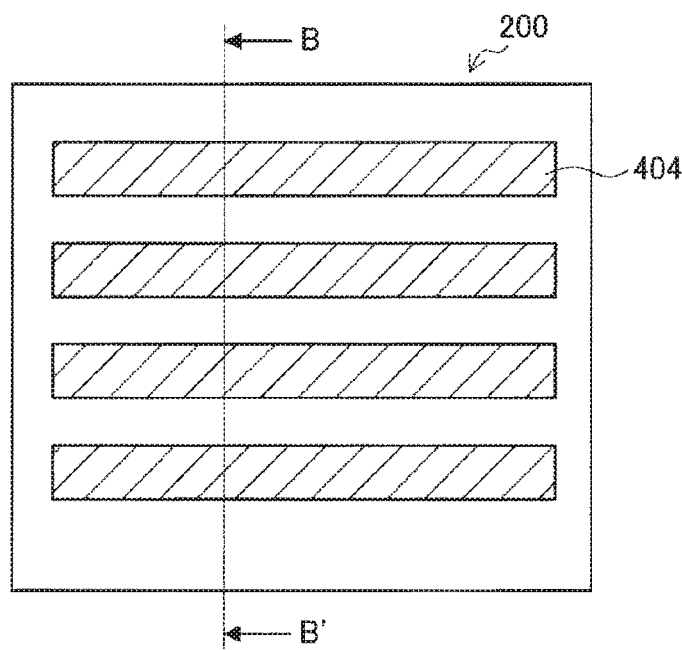
FIG. 14A is a plan view (No. 3) for describing steps in a method of manufacturing the magnetic memory 1 according to an embodiment of the present disclosure.
Figure 14B:
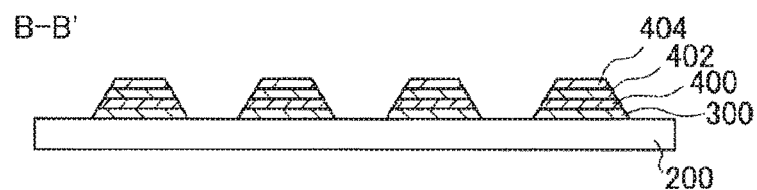
FIG. 14B is a cross-sectional view of a case of being cut along B-B' in FIG. 14A.

Then, as illustrated in FIGS. 14A and 14B, the magnetic layer 404, the insulating layer 402, the magnetic layer 400, and the spin orbit layer 300 are processed using reactive ion etching (RIE) or the like using a resist pattern (not illustrated) as a mask in a stripe manner.

Figure 15A:
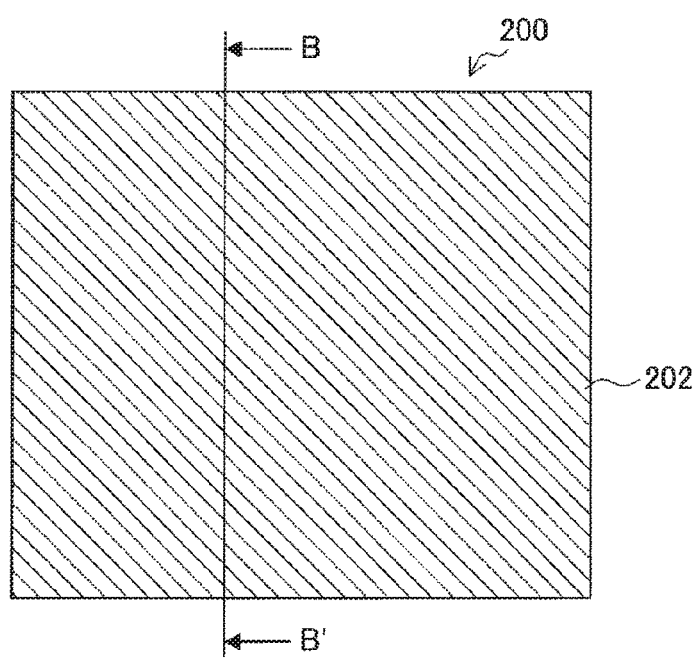
FIG. 15A is a plan view (No. 4) for describing steps in a method of manufacturing the magnetic memory 1 according to an embodiment of the present disclosure.
Figure 15B:
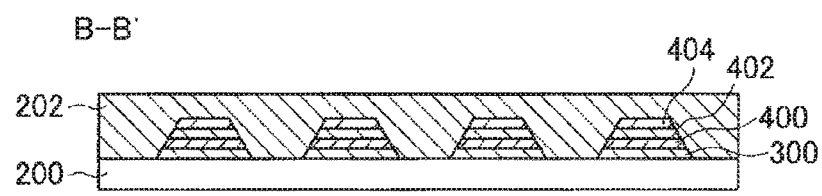
FIG. 15B is a cross-sectional view of a case of being cut along B-B' in FIG. 15A.

Moreover, as illustrated in FIGS. 15A and 15B, an insulating film 202 is embedded between the stripe-shaped laminated structures. At this time, as illustrated in FIG. 15B, the insulating film 202 is formed to cover the above-described laminated structures.

Figure 16A:
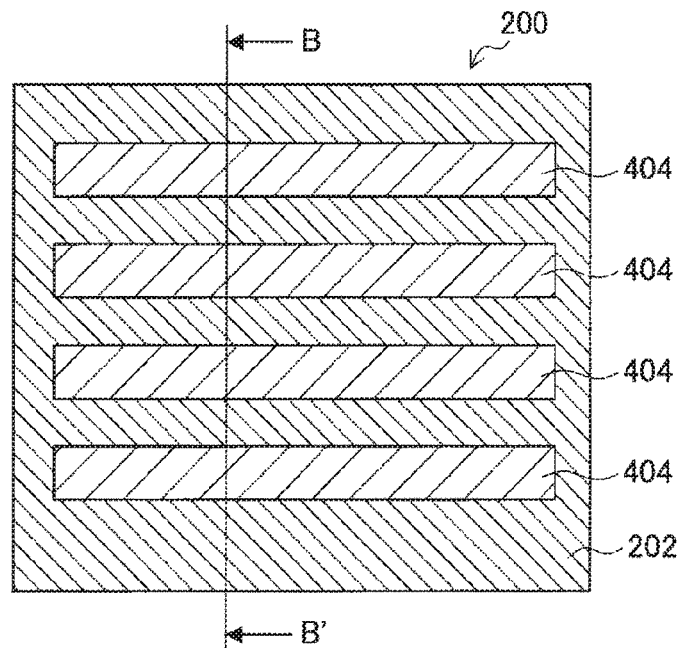
FIG. 16A is a plan view (No. 5) for describing steps in a method of manufacturing the magnetic memory 1 according to an embodiment of the present disclosure.
Figure 16B:
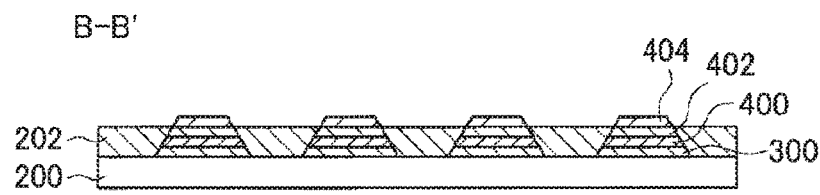
FIG. 16B is a cross-sectional view of a case of being cut along B-B' in FIG. 16A.

Next, as illustrated in FIGS. 16A and 16B, planarization is performed by chemical-mechanical polishing (CMP) until an upper surface of the magnetic layer 404 appears.

Figure 17A:
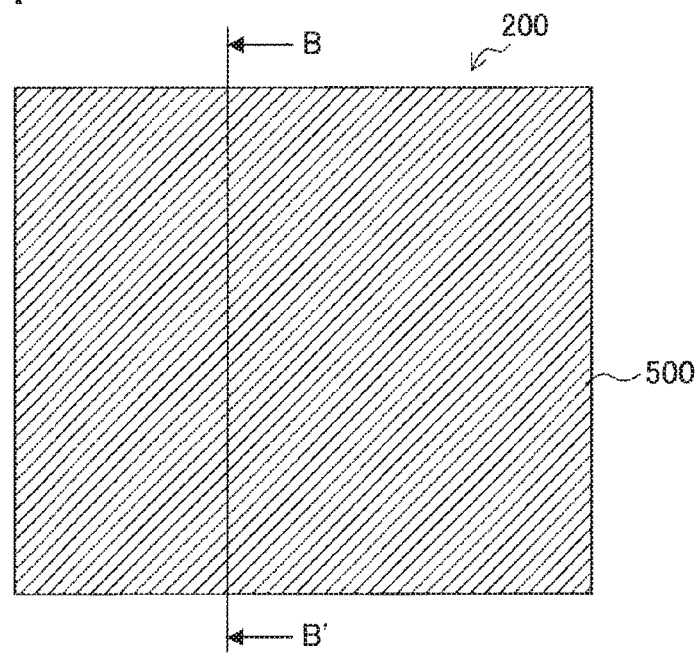
FIG. 17A is a plan view (No. 6) for describing steps in a method of manufacturing the magnetic memory 1 according to an embodiment of the present disclosure.
Figure 17B:
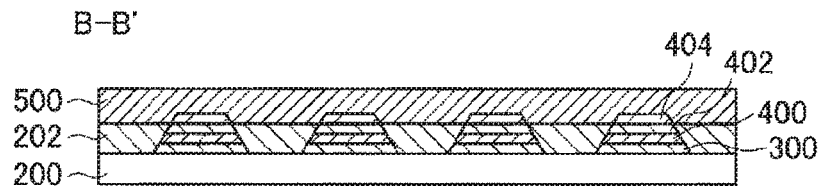
FIG. 17B is a cross-sectional view of a case of being cut along B-B' in FIG. 17A.

Then, as illustrated in FIGS. 17A and 17B, an electrode layer 500 is formed to cover the magnetic layer 404 and the insulating film 202.

Figure 18A:
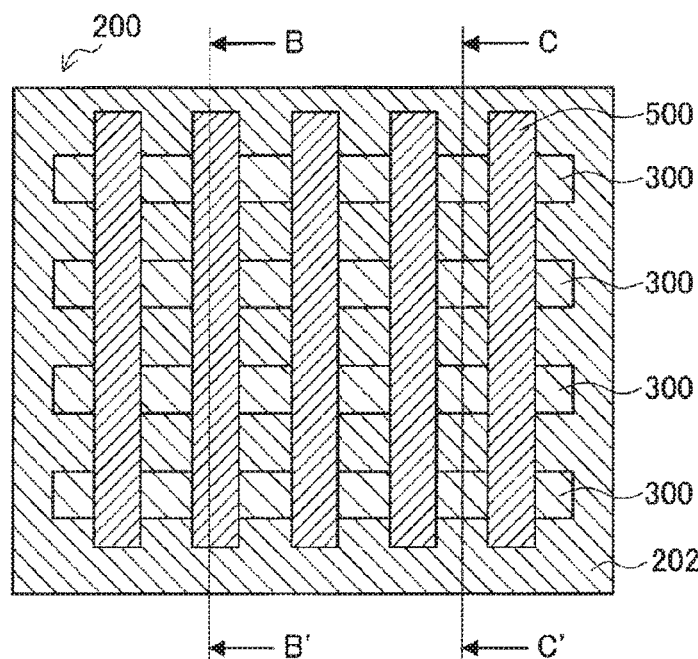
FIG. 18A is a plan view (No. 7) for describing steps in a method of manufacturing the magnetic memory 1 according to an embodiment of the present disclosure.
Figure 18B:
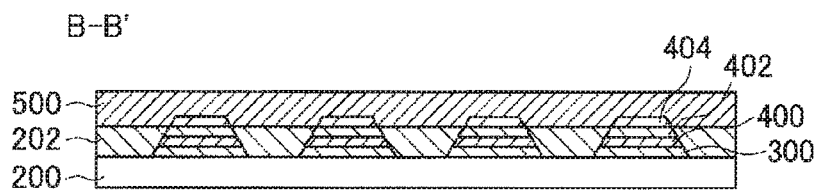
FIG. 18B is a cross-sectional view of a case of being cut along B-B' in FIG. 18A.
Figure 18C:
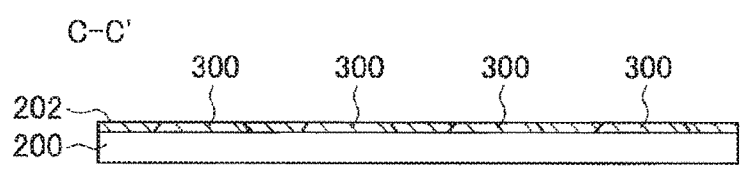
FIG. 18C is a cross-sectional view of a case of being cut along C-C' in FIG. 18A.

Moreover, as illustrated in FIGS. 18A, 18B, and 18C, the electrode layer 500 is etched by RIE or the like using a resist pattern (not illustrated) in a stripe manner extending in the direction orthogonal to the extending direction of the spin orbit layer 300. At this time, the electrode layer 500 is etched up to the spin orbit layer 300. Thereafter, wiring and the like are formed, so that the magnetic memory 1 according to the present embodiment can be formed.

Note that the magnetic memory 1 according to the present embodiment can be manufactured using an apparatus and conditions used for manufacturing a general semiconductor device. For example, the magnetic memory 1 according to the present embodiment can be manufactured by appropriately using a sputtering method, a chemical vapor deposition (CVD) method, a photolithography method, an etching method, a CMP method, or the like.

4. EXAMPLE

The details of the embodiment of the present disclosure have been described. Next, an example of an embodiment of the present disclosure will be more specifically described while showing specific examples. Note that examples to be described below are mere examples of an embodiment of the present disclosure, and the embodiment of the present disclosure is not limited to the examples below.

First Example

First, the magnetic memory according to a first example will be described. The magnetic memory according to the first example includes a W film with the film thickness of 5 nm as the spin orbit layer 20, an FeCoB film with the film thickness of 1.5 nm as the magnetic layer 100, an MgO film with the film thickness of 2 nm as the insulating layer 102, and a laminated film including an FeCoB film with the film thickness of 1 nm and a TbFeCo film with the film thickness of 5 nm as the magnetic layer 104 and the electrode layer 40. Moreover, the magnetic memory includes a W film with the film thickness of 5 nm as the protective film on the laminated film. Furthermore, the size of the magnetic memory element of the magnetic memory was 1 µm square. Then, in the magnetic memory 1, an insulating film containing $SiO_2$ was embedded between the magnetic memory elements, and wiring and the like were formed on the magnetic memory element. Note that the above-described laminated film forms the ferromagnetic tunnel junction between the laminated film and the magnetic layer 100, and thus can read information recorded on the magnetic memory element 10 from a resistance value of the magnetic memory element 10. Specifically, the resistance of the magnetic memory element of the magnetic memory according to the first example is 60 kΩ in a low resistance state and is 1.1 MΩ in a high resistance state.

Figure 19:
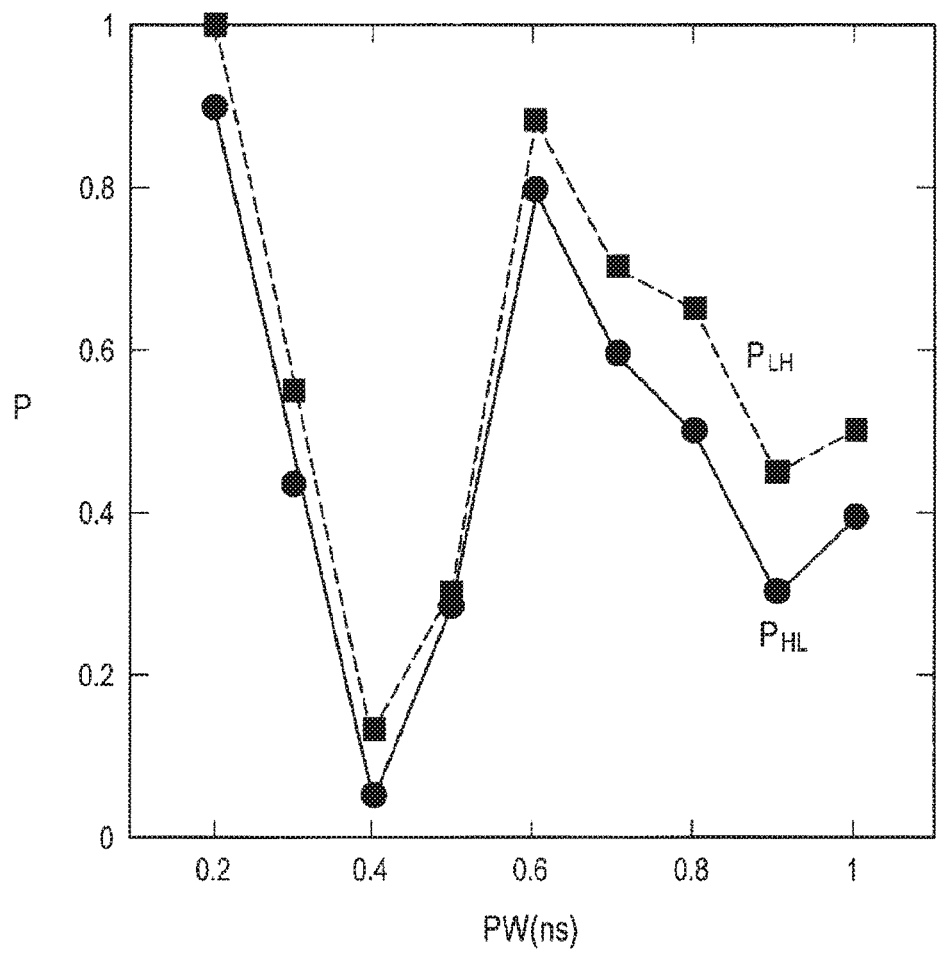
FIG. 19 is a graph illustrating a ratio (P) of an inversion error to a pulse width in a case where a pulse current to flow in a spin orbit layer 20 is 20 µA in the magnetic memory 1 according to a first example.

FIG. 19 illustrates a ratio (P) of an inversion error to a pulse width in a case where the pulse current to flow in the spin orbit layer 20 is 20 µA in the magnetic memory 1 according to the above-described first example. Note that the graph in FIG. 19 illustrates a result in a state where a voltage is not applied to the magnetic layer 100 by the electrode layer 40 of the magnetic memory. Specifically, the horizontal axis in FIG. 19 represents the pulse width (PW), and the vertical axis represents the ratio (P) of an inversion error. Note that, in the following description, the ratio of the inversion error in the case of changing the magnetic memory element from the high resistance state to the low resistance state is $P_{HL}$, and the ratio of the inversion error in the case of changing the magnetic memory element from the low resistance state to the high resistance state is $P_{LH}$. Furthermore, the case where the ratio of the inversion error is 1 indicates that the magnetic memory element is not inverted at all, and the case where the ratio of the inversion error is 0 indicates that the magnetic memory element is inverted as intended.

As illustrated in FIG. 19, change of the ratio of the inversion error was confirmed by changing the pulse width (PW). However, the ratio of the inversion error was not able to be made zero even in the case of changing the magnetic memory element from the high resistance state to the low resistance state or in the case of changing the magnetic memory element from the low resistance state to the high resistance state. In other words, it has been found that elimination of the inversion error by only controlling the pulse width (PW) is difficult.

Figure 20:
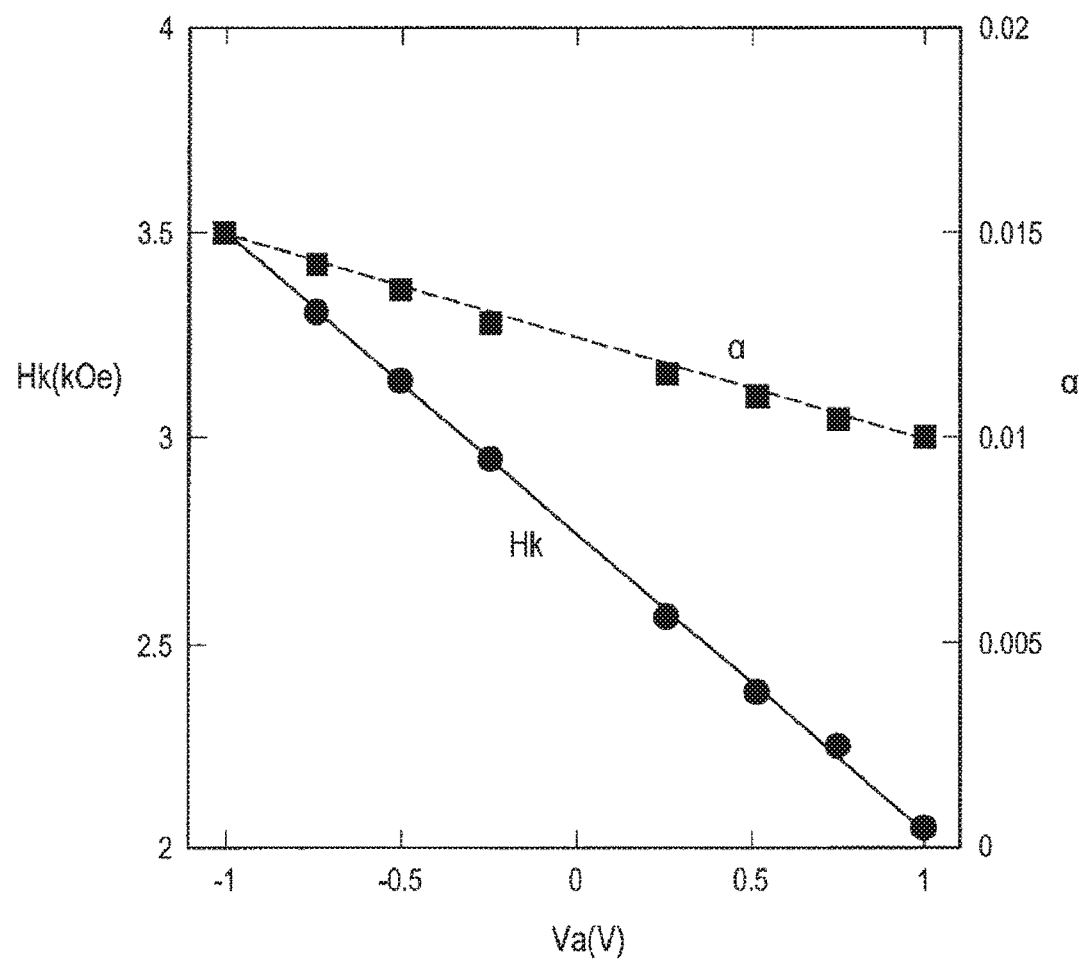
FIG. 20 is a graph illustrating change in the perpendicular magnetic anisotropy (Hk) and the magnetic damping constant ($\alpha$) with respect to an applied voltage in the magnetic memory 1 according to the first example.

Next, the effect of voltage application in the magnetic memory according to the first example was confirmed. The effect of voltage application was evaluated by applying the voltage to each magnetic memory element of the magnetic memory according to the first example using the electrode layer 40, and measuring change in the magnetic anisotropy (Hk) and the magnetic damping constant (α) of the magnetic layer 100 of the magnetic memory element with respect to the voltage using ferromagnetic resonance. The result is illustrated in FIG. 20. Note that, in FIG. 20, the horizontal axis represents a voltage (Va) to be applied, the left vertical axis represents the perpendicular magnetic anisotropy (Hk), and the right vertical axis represents the magnetic damping constant (α). Note that the voltage to be applied is illustrated such that a case in which a voltage of an electrode provided above a magnetic memory cell is higher than a voltage of an electrode provided below the magnetic memory cell becomes a positive direction.

As found from FIG. 20, the perpendicular magnetic anisotropy (Hk) and the magnetic damping constant (a) have changed by the applied voltage. Specifically, in the case where the voltage is applied in the positive direction, the perpendicular magnetic anisotropy (Hk) and the magnetic control constant (α) decreased (inversion acceleration direction). Furthermore, in the case where the voltage is applied in the negative direction, the perpendicular magnetic anisotropy (Hk) and the magnetic control constant (α) increased (inversion suppression direction).

Figure 21A:
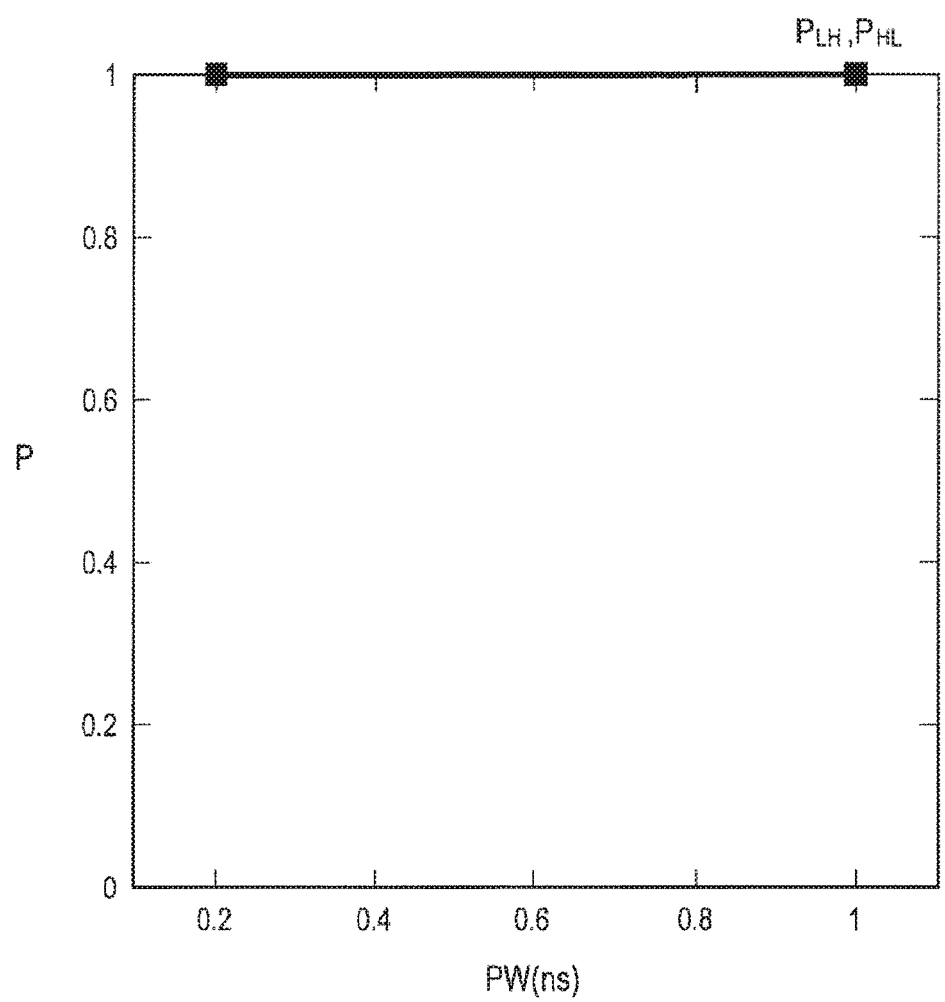
FIG. 21A is a graph illustrating a ratio (P) of an inversion error to a pulse width in a case where an applied voltage is −1 V and a pulse current to flow in a spin orbit layer 20 is 20 µA in the magnetic memory 1 according to the first example.
Figure 21B:
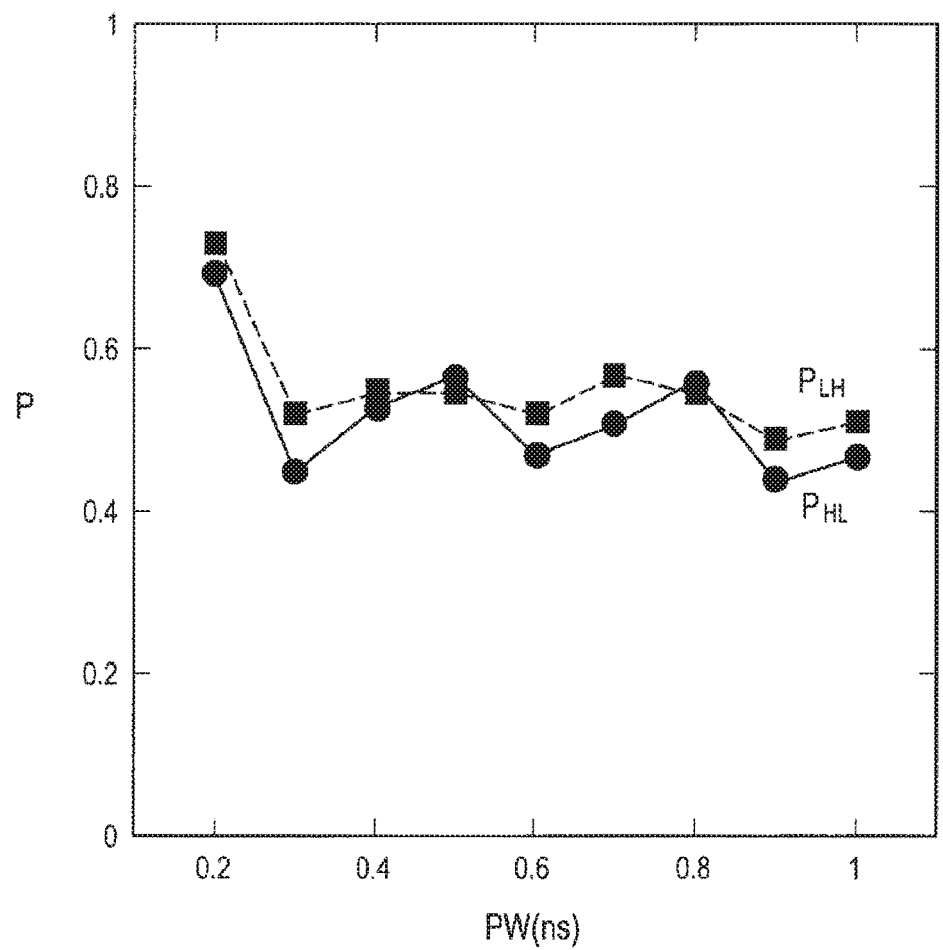
FIG. 21B is a graph illustrating a ratio (P) of an inversion error to a pulse width in a case where an applied voltage is +1 V and a pulse current to flow in a spin orbit layer 20 is 20 µA in the magnetic memory according to the first example.

Next, change in the inversion characteristics by voltage application was studied. FIGS. 21A and 21B illustrates the ratio (P) of the inversion error to the pulse width in a case where the applied voltage is −1 V or +1 V and the pulse current to flow in the spin orbit layer 20 is 20 μA in the magnetic memory 1 according to the first example. Specifically, FIG. 21A illustrates a result of the case where the applied voltage is −1 V (inversion suppression direction), and FIG. 21B illustrates a result of the case where the applied voltage is +1 V (inversion acceleration direction).

As illustrated in FIG. 21A, no inversion occurred in the magnetic memory element in the state where the applied voltage is −1 V. Meanwhile, as illustrated in FIG. 21B, inversion error occurs in the applied voltage of +1 V, and the ratio (P) of the inversion error varied near 0.5. This is because the magnetization direction of the magnetic layer 100 of the magnetic memory element is easily inverted by applying the applied voltage in the positive direction.

Next, in the magnetic memory according to the first example, the ratio (P) of the inversion error in the case of causing the pulse current to flow in the spin orbit layer 20 in the state where no voltage is applied to the electrode layer 40 and applying the voltage of +1 V to the electrode layer 40 after the pulse current decreases was studied. At this time, the pulse current was 20 μA, and the pulse width was changed. The result obtained at this time is illustrated in FIG. 22.

Figure 22:
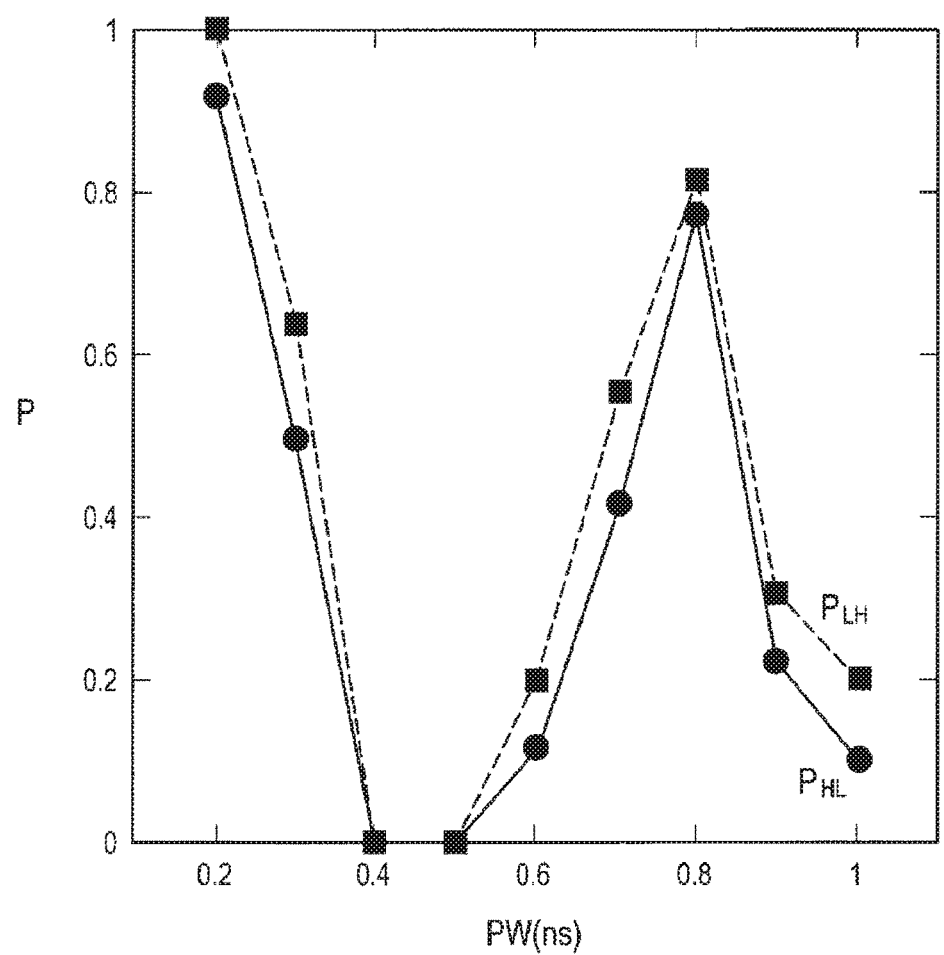
FIG. 22 is a graph illustrating a ratio (P) of an inversion error to a pulse width in a case where an applied voltage of +1 V is applied after a pulse current of 20 µA is caused to flow in the spin orbit layer 20 in the magnetic memory according to the first example.

As illustrated in FIG. 22, the ratio (P) of the inversion error is 0, in other words, the inversion error is eliminated, in a range of the pulse width (PW) from 0.4 to 0.5 ns. Therefore, the effect is confirmed by applying the voltage using the electrode layer 40.

Next, in the magnetic memory according to the first example, the ratio (P) of the inversion error in the case of causing the pulse current to flow in the spin orbit layer 20 in the state where the voltage of −1 V is applied to the electrode layer 40 and applying the voltage of +1 V to the electrode layer 40 after the pulse current decreases was studied. Note that, at this time, the pulse current was 20 μA, and the pulse width was changed. The result obtained at this time is illustrated in FIG. 23.

Figure 23:
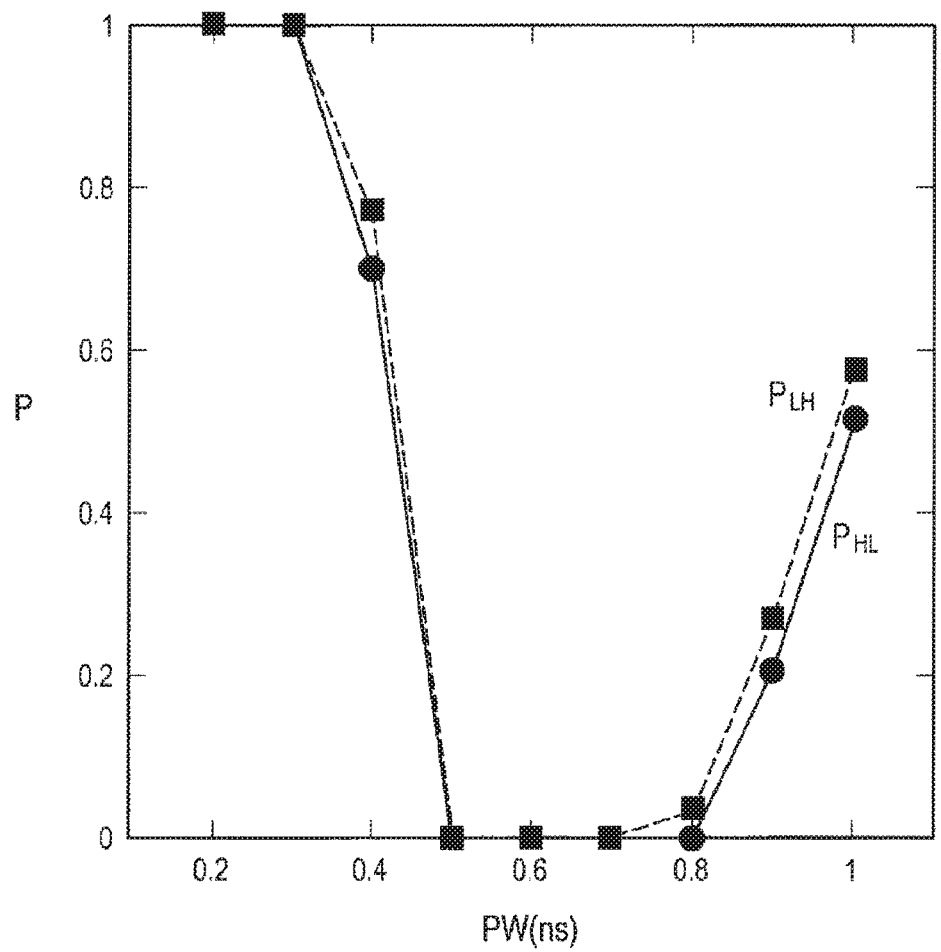
FIG. 23 is a graph illustrating a ratio (P) of an inversion error to a pulse width in a case where an applied voltage of −1 V is applied at the same time as the pulse current of 20 µA being caused to flow in the spin orbit layer 20, and an applied voltage of +1 V is applied at the same time as the pulse current being caused to flow in the spin orbit layer 20 in the magnetic memory according to the first example.

As illustrated in FIG. 23, it has been found that the ratio (P) of the inversion error becomes 0, in other words, the inversion error becomes eliminated in a wider pulse width range than FIG. 22, by applying a voltage having different polarity to the electrode layer 40 at the same time as the pulse current and after the pulse current decreases. Therefore, an effect of decreasing the inversion error is confirmed by controlling the voltage of the electrode layer 40.

Second Example

Next, a second example of a case where two magnetic memory elements are provided in a common spin orbit layer 20 was studied. In the second example, a magnetic memory element similar to the first example was provided, and the interval between adjacent magnetic memories was 2 μm.

Figure 24:
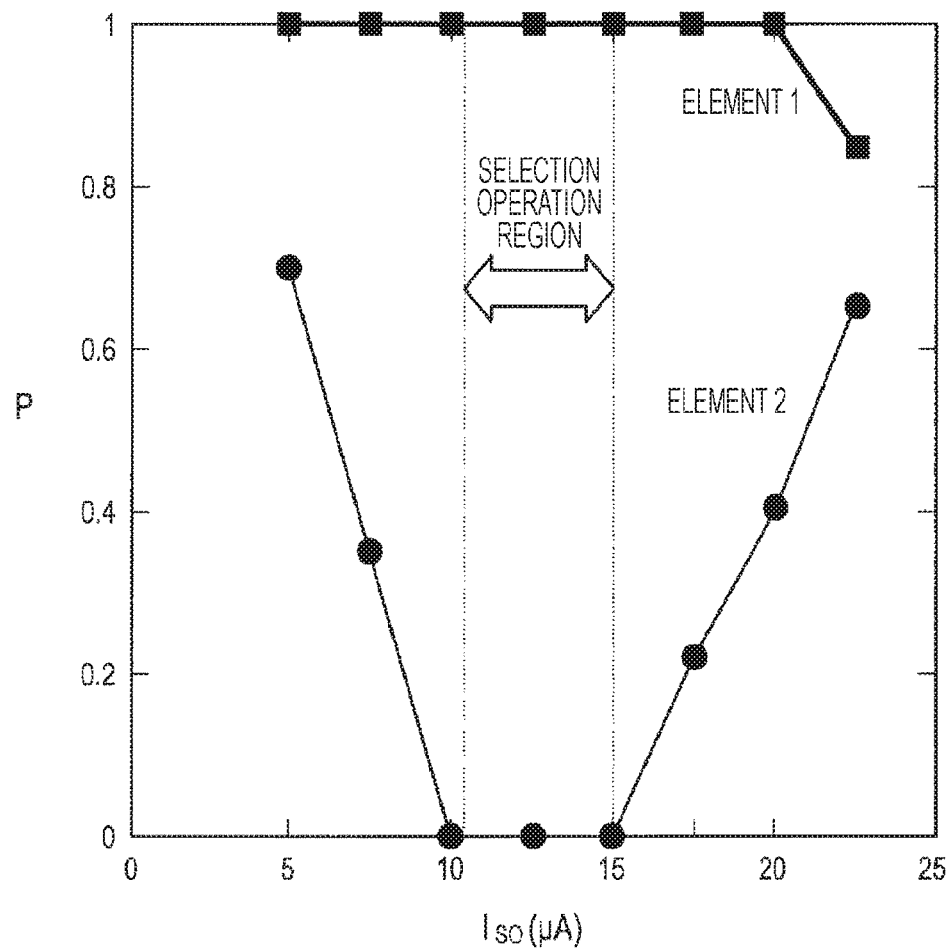
FIG. 24 is a graph illustrating a ratio (P) of an inversion error to a pulse current value (Iso) in a magnetic memory according to a second example.

Then, a pulse current (Iso) having the pulse width of 0.5 nsec was applied to the common spin orbit layer 20 while changing the current value. Furthermore, the voltage of −1 V was applied to the electrode layer 40 of one magnetic memory element (element 1) and the voltage of +1 V was applied to the electrode layer 40 of the other magnetic memory element (element 2) at the time of applying the pulse current, and the voltage of −1 V was applied after the pulse current decreased. The result obtained in this way is illustrated in FIG. 24. Note that, in FIG. 24, the horizontal axis represents the pulse current (Iso), and the vertical axis represents the ratio (P) of the inversion error.

As illustrated in FIG. 24, it has been found that no inversion occurs in the element 1, and a range (selection operation range) where inversion occurs without an inversion error exists in the element 2. Therefore, according to the present embodiment, it has been confirmed that the desired magnetic memory element can be stably and selectively inverted even in the case of the plurality of magnetic memory elements provided on the common spin orbit layer 20.

5. CONCLUSION

According to the embodiment of the present disclosure, a magnetic memory capable of suppressing an inversion error and performing stable recording.

Note that the magnetic memory 1 according to the present embodiment may be mounted on the same semiconductor chip together with a semiconductor circuit forming an arithmetic unit or the like to form a semiconductor device (system-on-a-chip: SoC). Furthermore, the magnetic memory 1 according to the present embodiment may be mounted on various electric devices in which a storage device can be mounted. For example, the magnetic memory 1 can be mounted on various electronic devices such as various mobile devices (smartphones, tablet personal computers (PCs), and the like), notebook PCs, wearable devices, game devices, music devices, video devices, or digital cameras, as a memory for temporary storage or as a storage.

6. SUPPLEMENT>>

Although the favorable embodiments of the present disclosure have been described in detail with reference to the accompanying drawings, the technical scope of the present disclosure is not limited to such examples. It is obvious that persons having ordinary knowledge in the technical field of the present disclosure can conceive various changes and alterations within the scope of the technical idea described in the claims, and it is naturally understood that these changes and alterations belong to the technical scope of the present disclosure.

Furthermore, the effects described in the present specification are merely illustrative or exemplary and are not restrictive. That is, the technology according to the present disclosure can exhibit other effects obvious to those skilled in the art from the description of the present specification together with or in place of the above-described effects.

Note that following configurations also belong to the technical scope of the present disclosure.

(1)

A magnetic memory including:

a spin orbit layer in which a spin-polarized electron is generated by a current;

a magnetic memory element having a laminated structure including a magnetic layer in which a magnetization direction changes according to information to be recorded and an insulating layer, and provided on the spin orbit layer; and a voltage application layer for applying a voltage to the magnetic layer via the insulating layer, in which the voltage application layer applies a voltage to the magnetic layer at a same time as the current flowing in the spin orbit layer to change magnetic anisotropy or a magnetic damping constant of the magnetic layer.

(2)

The magnetic memory according to (1), in which the voltage application layer further includes another magnetic layer different from the magnetic layer.

(3)

The magnetic memory according to (1) or (2), in which the spin orbit layer is provided to extend along a first direction, a plurality of the magnetic memory elements is provided on the spin orbit layer along the first direction, and a plurality of the voltage application layers for applying a voltage to each of the magnetic layers of the plurality of magnetic memory elements is provided.

(4)

A magnetic memory including:

a plurality of magnetic memory elements arranged in a matrix manner, each magnetic memory element having a laminated structure including a magnetic layer in which a magnetization direction changes according to information to be recorded and an insulating layer;

a plurality of spin orbit layers provided to correspond to each magnetic memory element column including the plurality of magnetic memory elements arranged along a first direction, and in which a spin-polarized electron is generated by a current; and a plurality of voltage application layers provided to correspond to each magnetic memory element row including the plurality of magnetic memory elements arranged along a second direction orthogonal to the first direction, and configured to apply a voltage to the respective magnetic layers of the plurality of magnetic memory elements included in the each magnetic memory element row via the insulating layer, in which the voltage application layer applies the voltage to the magnetic layer of the corresponding magnetic memory element at a same time as the current flowing in the spin orbit layer to change magnetic anisotropy or a magnetic damping constant of the magnetic layer.

(5)

A magnetic memory recording method, the magnetic memory including a spin orbit layer in which a spin-polarized electron is generated by a current, a magnetic memory element having a laminated structure including a magnetic layer in which a magnetization direction changes according to information to be recorded and an insulating layer, and provided on the spin orbit layer, and a voltage application layer for applying a voltage to the magnetic layer via the insulating layer, the method including:

applying a first voltage to the magnetic layer to lower magnetic anisotropy of the magnetic layer or to lower a magnetic damping constant and causing a current to flow in the spin orbit layer at a same time by the voltage application layer.

(6)

The magnetic memory recording method according to (5), further including:

applying a second voltage having an opposite polarity to the first voltage to the magnetic layer by the voltage application layer behind the current or after the current decreases.

(7)

A magnetic memory recording method, the magnetic memory including a spin orbit layer in which a spin-polarized electron is generated by a current, a magnetic memory element having a laminated structure including a magnetic layer in which a magnetization direction changes according to information to be recorded and an insulating layer, and provided on the spin orbit layer, and a voltage application layer for applying a voltage to the magnetic layer via the insulating layer, the method including:

causing a current to flow in the spin orbit layer; and applying a third voltage to the magnetic layer to improve magnetic anisotropy of the magnetic layer or to improve a magnetic damping constant by the voltage application layer behind the current or after the current decreases.

(8)

A magnetic memory recording method, the magnetic memory including a plurality of magnetic memory elements arranged in a matrix manner, each magnetic memory element having a laminated structure including a magnetic layer in which a magnetization direction changes according to information to be recorded and an insulating layer, a plurality of spin orbit layers provided to correspond to each magnetic memory element column including the plurality of magnetic memory elements arranged along a first direction, and in which a spin-polarized electron is generated by a current, and a plurality of voltage application layers provided to correspond to each magnetic memory element row including the plurality of magnetic memory elements arranged along a second direction orthogonal to the first direction, and configured to apply a voltage to the respective magnetic layers of the plurality of magnetic memory elements included in the each magnetic memory element row via the insulating layer, the method including:

controlling the voltage to be applied to the magnetic layer by the voltage application layer to select the magnetic memory element to which information is recorded.

(9)

The magnetic memory recording method according to (8), in which the selection of the magnetic memory element to which information is recorded is performed by applying a fourth voltage to lower magnetic anisotropy of the magnetic layer or to lower a magnetic damping constant, and causing a current to flow in the spin orbit layer corresponding to the magnetic memory element to which information is recorded at a same time, by the voltage application layer corresponding to the magnetic memory element to which information is recorded.

(10)

The magnetic memory recording method according to (9), further including:

applying a fifth voltage having a polarity opposite to a polarity of the fourth voltage to the magnetic layer by the voltage application layer corresponding to the magnetic memory element other than the magnetic memory element to which information is recorded in selecting the magnetic memory element to which information is recorded.

REFERENCE SIGNS LIST

1 Magnetic memory
10 Magnetic memory element
20, 300 Spin orbit layer
40 Electrode layer
50 Electrode
100, 104, 400, 404 Magnetic layer
102, 402 Insulating layer
200 Substrate
202 Insulating film
500 Electrode layer
600 Magnetic moment
700 Spin torque
800 Spin-polarized electron
900, 902 Arrow

The invention claimed is:

1. A magnetic memory, comprising:
a spin orbit layer configured to generate a spin-polarized electron by a current;
a magnetic memory element on the spin orbit layer, wherein the magnetic memory element has a laminated structure that includes:
a first magnetic layer in which a magnetization direction changes based on information to be recorded; and
an insulating layer; and
a voltage application layer configured to:
apply a first voltage to the first magnetic layer via the insulating layer, wherein the first voltage is applied to the first magnetic layer at a same time as the current flows in the spin orbit layer to decrease at least one of magnetic anisotropy of the first magnetic layer or a magnetic damping constant of the first magnetic layer; and
apply a second voltage to the first magnetic layer based on a decrease of the current, wherein the second voltage has a polarity opposite to a polarity of the first voltage.

2. The magnetic memory according to claim 1, wherein the voltage application layer includes a second magnetic layer different from the first magnetic layer.

3. The magnetic memory according to claim 1, wherein the spin orbit layer extends along a first direction, and the magnetic memory further comprises:
a plurality of magnetic memory elements on the spin orbit layer along the first direction; and
a plurality of voltage application layers configured to apply the first voltage to each of a plurality of magnetic layers of the plurality of magnetic memory elements.

4. A magnetic memory, comprising:
a plurality of magnetic memory elements in a matrix manner, wherein
each magnetic memory element of the plurality of magnetic memory elements has a laminated structure, and
the laminating structure includes:
a magnetic layer in which a magnetization direction changes based on information to be recorded; and
an insulating layer;
a plurality of spin orbit layers, wherein
each spin orbit layer of the plurality of spin orbit layers is configured to generate a spin-polarized electron by a current, and
each spin orbit layer of the plurality of spin orbit layers corresponds to a respective magnetic memory element column that includes a plurality of first magnetic elements of the plurality of magnetic memory elements along a first direction; and
a plurality of voltage application layers, wherein
each voltage application layer of the plurality of voltage application layers corresponds to a respective magnetic memory element row that includes a plurality of second magnetic elements of the plurality of magnetic memory elements along a second direction orthogonal to the first direction, and
each voltage application layer of the plurality of voltage application layers is configured to:
apply, via the insulating layer, a first voltage to the magnetic layer of a respective magnetic memory element of the plurality of magnetic memory elements in the respective magnetic memory element row, wherein
the first voltage is applied to the magnetic layer corresponding to the respective magnetic memory element, at a same time as the current flows in a spin orbit layer of the plurality of spin orbit layers, to decrease at least one of magnetic anisotropy of the magnetic layer or a magnetic damping constant of the magnetic layer; and
apply a second voltage to the magnetic layer of the respective magnetic memory element based on a decrease of the current, wherein the second voltage has a polarity opposite to a polarity of the first voltage.

5. A magnetic memory recording method, comprising:
applying, by a voltage application layer of a magnetic memory, a first voltage to a magnetic layer of a magnetic memory element of the magnetic memory to decrease at least one of magnetic anisotropy of the magnetic layer or a magnetic damping constant of the magnetic layer, wherein
the magnetic memory element has a laminated structure that includes:
the magnetic layer in which a magnetization direction changes based on information to be recorded; and
an insulating layer, wherein the first voltage is applied to the magnetic layer via the insulating layer;
causing a current to flow in a spin orbit layer of the magnetic memory at a same time as the first voltage is applied to the magnetic layer; and
applying, by the voltage application layer, a second voltage to the magnetic layer based on a decrease of the current, wherein the second voltage has a polarity opposite to a polarity of the first voltage.

6. A magnetic memory recording method, comprising:
causing a current to flow in a spin orbit layer of a magnetic memory; and
applying, by a voltage application layer of the magnetic memory, a voltage to a magnetic layer of a magnetic memory element of the magnetic memory to increase at least one of magnetic anisotropy of the magnetic layer or a magnetic damping constant of the magnetic layer based on a decrease of the current, wherein
the magnetic memory element has a laminated structure that includes:
the magnetic layer in which a magnetization direction changes based on information to be recorded; and
an insulating layer, wherein the voltage is applied via the insulating layer.

7. A magnetic memory recording method, comprising:
controlling, by a first voltage application layer of a plurality of voltage application layers of a first magnetic memory element of a plurality of magnetic memory elements of a magnetic memory, a first voltage to be applied to a magnetic layer of the first magnetic memory element to select the first magnetic memory element to which information is recorded, wherein
the first voltage is applied to the magnetic layer, at a same time as a current flows in a spin orbit layer of a plurality of spin orbit layers, to decrease at least one of magnetic anisotropy of the magnetic layer or a magnetic damping constant of the magnetic layer,
the plurality of magnetic memory elements is in a matrix manner,
each magnetic memory element of the plurality of magnetic memory elements has a laminated structure,
the laminating structure includes:
the magnetic layer in which a magnetization direction changes based on information to be recorded; and
an insulating layer, wherein the first voltage is applied to the magnetic layer via the insulating layer,
each spin orbit layer of the plurality of spin orbit layers generates a spin polarized electron by the current,
each spin orbit layer of the plurality of spin orbit layers corresponds to a respective magnetic memory element column that includes a plurality of first magnetic elements of the plurality of magnetic memory elements along a first direction, and
each voltage application layer of the plurality of voltage application layers corresponds to a respective magnetic memory element row that includes a plurality of second magnetic elements of the plurality of magnetic memory elements along a second direction orthogonal to the first direction; and
controlling, by the first voltage application layer, a second voltage to be applied to the magnetic layer of the first magnetic memory element based on a decrease of the current, wherein the second voltage has a polarity opposite to a polarity of the first voltage.

8. The magnetic memory recording method according to claim 7, further comprising
applying, by a second voltage application layer of the plurality of voltage application layers of a second magnetic memory element of the plurality of magnetic memory elements, a second fifth voltage having a polarity opposite to a polarity of the first voltage to the magnetic layer of the second magnetic memory element for the selection of the first magnetic memory element.

* * * * *